(12) United States Patent  (10) Patent No.: US 8,592,853 B2
Tanaka et al.  (45) Date of Patent: Nov. 26, 2013

(54) SEMICONDUCTOR LIGHT EMITTING ELEMENT

(75) Inventors: Hidetoshi Tanaka, Anan (JP); Keiji Emura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/218,338

(22) Filed: Aug. 25, 2011

(65) Prior Publication Data

US 2012/0049238 A1 Mar. 1, 2012

(30) Foreign Application Priority Data

Aug. 26, 2010 (JP) ................................ 2010-189755
Aug. 24, 2011 (JP) ................................ 2011-182683

(51) Int. Cl.
 *H01L 33/62* (2010.01)
(52) U.S. Cl.
 USPC ............... 257/99; 438/33; 438/108; 438/112; 438/114; 438/127
(58) Field of Classification Search
 USPC ......... 257/99; 438/22, 33, 108, 112, 114, 127
 See application file for complete search history.

(56) References Cited

U.S. PATENT DOCUMENTS

| 6,136,627 | A | * | 10/2000 | Ogihara et al. | ................. 438/45 |
| 6,777,805 | B2 | | 8/2004 | Uemura et al. | |
| 7,042,089 | B2 | | 5/2006 | Uemura et al. | |
| 2006/0001035 | A1 | | 1/2006 | Suehiro et al. | |
| 2007/0085095 | A1 | | 4/2007 | Ko et al. | |
| 2007/0221944 | A1 | * | 9/2007 | Cheol Yoo | ...................... 257/99 |
| 2009/0159909 | A1 | * | 6/2009 | Lee et al. | .......................... 257/96 |
| 2010/0127397 | A1 | * | 5/2010 | Chen et al. | .................... 257/773 |
| 2010/0201254 | A1 | * | 8/2010 | Matsumura | ................... 313/501 |

FOREIGN PATENT DOCUMENTS

| JP | 2001-345480 | 12/2001 |
| JP | 2004-056109 | 2/2004 |
| JP | 2006-012916 | 1/2006 |
| JP | 2007-116153 | 5/2007 |

* cited by examiner

*Primary Examiner* — Benjamin Sandvik
*Assistant Examiner* — Rodolfo Fortich
(74) *Attorney, Agent, or Firm* — Foley & Lardner LLP

(57) ABSTRACT

A semiconductor light emitting element includes: a semiconductor layer; first electrodes arranged in a staggered array on an upper surface of the semiconductor layer; and a second electrode on a lower surface of the semiconductor layer. Each first electrode includes an external connection, a first elongated portion which extends from the external connection toward a central region of the upper surface of the semiconductor layer, and a second elongated portion which extends from the external connection to a near-edge region of the semiconductor layer. In addition, the first electrodes are arrayed so that a near-tip part of the first elongated portion of each first electrode is opposed to a near-tip part of the first elongated portion of each of an adjacent one or ones of the first electrodes in a direction in which the first electrodes arranged, on the central region of the semiconductor layer.

20 Claims, 21 Drawing Sheets

Reference Line

Center Line

| | Comparison Example 1 | Comparison Example 2 | Comparison Example 3 | Concrete Example 1 | Concrete Example 2 | Concrete Example 3 | Concrete Example 4 | Concrete Example 5 | Concrete Example 6 |
|---|---|---|---|---|---|---|---|---|---|
| Current MAX [A/m²] | 464576 | 480273 | 474579 | 429064 | 424214 | 413981 | 411207 | 420913 | 429735 |
| Current MIN [A/m²] | 0.002299 | 0.00275 | 0.00232 | 0.093602 | 0.01502 | 0.08606 | 0.08435 | 0.02571 | 0.014637 |
| Relative Value [a.u] | 1 | 1.033788 | 1.021531 | 0.92356 | 0.913121 | 0.891094 | 0.885123 | 0.906015 | 0.925005 |

SEMICONDUCTOR LIGHT EMITTING ELEMENT

CROSS REFERENCE TO RELATED APPLICATION

This application claims priority under 35 U.S.C. §119 to Japanese Patent Application Nos. 2010-189755 and 2011-182683, filed on Aug. 26, 2010 and Aug. 24, 2011, respectively, the disclosure of which are incorporated herein by reference.

BACKGROUND OF THE INVENTION

1. Field of the Invention

The present invention relates to a semiconductor light emitting element having an opposed-electrode structure in which a positive electrode and a negative electrode are formed as a pair to sandwich semiconductor layers.

2. Description of the Related Art

Conventionally, in the field of the semiconductor light emitting elements, uniform inplane distribution of light emission is demanded, and therefore uniform current density is required in the gap between the electrodes. For example, for the semiconductor light emitting elements in which a positive electrode (p-electrode) and a negative electrode (n-electrode) are formed as a pair on the same side of a semiconductor layer, techniques for homogenizing the current density by equalizing the distances between the p-electrode and the n-electrode as much as possible have been disclosed, for example, in Japanese Patent Laid-open Nos. 2006-012916, 2001-345480, 2007-116153, and 2004-056109 (which are hereinafter referred to as JP 2006-012916 A, JP 2001-345480 A, JP 2007-116153 A, and JP 2004-056109 A, respectively). (See FIG. 8 in JP 2006-012916 A, FIG. 1 in JP 2001-345480 A, FIG. 2 in JP 2007-116153 A, and FIG. 3 in JP 2004-056109 A.)

Specifically, JP 2006-012916 A proposes a light emitting element having a comb-like electrode arrangement in which a p-electrode region and an n-electrode region extend deep into each other. JP 2001-345480 A proposes a semiconductor light emitting element in which the maximum distance between the p-electrode region and the n-electrode region is 500 micrometers or less.

JP 2007-116153 A proposes a semiconductor light emitting element in which a p-type electrode is sectioned by first and second n-type branch electrodes, and all the sections of the p-type electrode are electrically connected. JP 2004-056109 A proposes a semiconductor light emitting element in which linear n-electrodes are formed on a plurality of portions of an n-type layer exposed through a plurality of slits, and p-electrodes constituted by a p-ohmic electrode and current diffusion conductors are formed adjacent to the linear n-electrodes.

However, in the conventional semiconductor light emitting elements having an opposed-electrode structure in which a positive electrode and a negative electrode are formed as a pair to sandwich semiconductor layers, it has been impossible to homogenize the current density in the gap between the electrodes even if the electrodes are arranged in a similar manner to one of the proposals by JP 2006-012916 A, JP 2001-345480 A, JP 2007-116153 A, and JP 2004-056109 A. The reason for the impossibility of homogenization can be considered as follows. That is, current flows in the thickness direction (surface normal direction) in the semiconductor light emitting elements having the opposed-electrode structure, while current strongly tends to flow in an in-plane direction in the semiconductor light emitting elements in which a positive electrode and a negative electrode are formed as a pair on the same side of a semiconductor layer. Therefore, the current flow and the electrode arrangement which is suitable for the current flow are completely different between the semiconductor light emitting elements having the opposed-electrode structure and the semiconductor light emitting elements in which a positive electrode and a negative electrode are formed on the same side of a semiconductor layer.

Particularly, in the semiconductor light emitting elements proposed by JP 2006-012916 A, JP 2001-345480 A, JP 2007-116153 A, and JP 2004-056109 A, the external connections and the branch points of elongated portions are arranged near the side faces of a semiconductor layer because of necessity to attain the greatest possible light emission area. Further, in the semiconductor light emitting elements proposed by JP 2006-012916 A, JP 2001-345480 A, and JP 2007-116153 A, electrodes are continually arranged near the side faces of semiconductor layers. Therefore, if the electrode arrangement in the semiconductor light emitting elements having the opposed-electrode structure is modified to an arrangement similar to the arrangements proposed by JP 2006-012916 A, JP 2001-345480 A, JP 2007-116153 A, and JP 2004-056109 A, the external connections and the branch points of elongated portions are arranged near the side faces of the semiconductor layers. Since current is likely to concentrate in the regions near the side faces because of the above electrode formation, and is inherently likely to concentrate around the external connections and the branch points of elongated portions, the concentration of current in the regions near the side faces is further enhanced by the above arrangement of the external connections and the branch points of elongated portions, so that the variations in the current density between the central region and the regions near the side faces of the semiconductor layers increase. That is, according to the conventionally proposed techniques, it is impossible to uniform the distribution of light emission in the semiconductor light emitting elements having the opposed-electrode structure.

The present invention has been developed in view of the above circumstances. The object of the present invention is to improve the overall distribution of light emission in a semiconductor light emitting element having the opposed-electrode structure (in which a positive electrode and a negative electrode are formed as a pair to sandwich semiconductor layers) by homogenizing the current density in the gap between the electrodes.

SUMMARY OF THE INVENTION

In order to accomplish the above object, a semiconductor light emitting element according to the first aspect of the present invention is provided. The semiconductor light emitting element according to the first aspect of the present invention includes: a semiconductor layer; a plurality of first electrodes arranged in a staggered array on an upper surface of the semiconductor layer; and a second electrode on a lower surface of the semiconductor layer. Each of the first electrodes includes an external connection, a first elongated portion which extends from the external connection toward a central region of the upper surface of the semiconductor layer, and a second elongated portion which extends from the external connection to a near-edge region of the semiconductor layer. In addition, the first electrodes are arranged so that a near-tip part of the first elongated portion of each of the first electrodes is opposed to a near-tip part of the first elongated portion of each of an adjacent one or ones of the first electrodes in a direction in which the plurality of first electrodes are arrayed, on the central region of the semiconductor layer.

Since, in the above semiconductor light emitting element according to the first aspect of the present invention, each of the first electrodes has the first and second elongated portions, it is possible to spread the current over the entire semiconductor layer including the near-edge region and the central region, i.e., relieve the concentration of current, which is likely to occur around the external connections. In addition, since the near-tip parts of the first elongated portions of the first electrodes extend to the central region of the semiconductor layer 2 so that the near-tip part of the first elongated portion of each of the first electrodes is opposed to the near-tip part of the first elongated portion of each of an adjacent one or ones of the first electrodes in the direction in which the first electrodes are arrayed, on the central region of the semiconductor layer, it is possible to sufficiently compensate for the insufficiency of current in the central region of the semiconductor layer, although the insufficiency of current is particularly likely to occur in the central region of the semiconductor layer.

In order to accomplish the aforementioned object, a semiconductor light emitting element according to the second aspect of the present invention is also provided. The semiconductor light emitting element according to the second aspect of the present invention includes: a semiconductor layer; a plurality of first electrodes arranged in a staggered array on an upper surface of the semiconductor layer; a second electrode on a lower surface of the semiconductor layer; and a traverse electrode being arranged on a central region of the upper surface of the semiconductor layer and connecting the plurality of first electrodes on the central region. Each of the first electrodes includes an external connection, a first elongated portion which extends from the external connection toward the central region of the upper surface of the semiconductor layer and has an end located on the central region, and a second elongated portion which extends from the external connection to a near-edge region of the semiconductor layer in a direction opposite to extension of the first elongated portion. The traverse electrode connects the plurality of first electrodes at the end of the first elongated portion.

Since, in the above semiconductor light emitting element according to the second aspect of the present invention, each of the first electrodes has the first and second elongated portions, it is possible to spread the current over the entire semiconductor layer including the near-edge region and the central region, i.e., relieve the concentration of current, which is likely to occur around the external connections. In addition, since the ends of the first elongated portions of the first electrodes are connected through the traverse electrode on the central region of the semiconductor layer, it is possible to sufficiently compensate for the insufficiency of current in the central region of the semiconductor layer, although the insufficiency of current is particularly likely to occur in the central region of the semiconductor layer.

Preferably, the semiconductor light emitting elements according to the first and second aspects of the present invention may also have one or any possible combination of the following additional features (i) to (v).

(i) In the semiconductor light emitting elements according to the first and second aspects of the present invention, the external connection in each of the first electrodes and the external connection in another of the first electrodes are arranged on a straight line in a first direction in which two side faces of the semiconductor layer are opposed to each other, a first part of the first elongated portion extends in a second direction which is inclined from the first direction, and a second part of the first elongated portion other than the first part extends in the first direction.

In the semiconductor light emitting elements having the above feature (i), the external connection in each of the first electrodes and the external connection in another of the first electrodes are arranged on the straight line. Therefore, it is possible to regularize the distances from the side faces of the semiconductor layer to the external connections, and thus relieve the concentration of current or the insufficiency of current in the gap between the external connections and the side faces of the semiconductor layer. In addition, since the first elongated portion curves along predetermined directions, the area of the electrodes increases, and the current can be spread over a wider area of the semiconductor layer.

(ii) In the semiconductor light emitting element according to the first aspect of the present invention, the near-tip part of the first elongated portion of each of the first electrodes which is opposed to the near-tip part(s) of the first elongated portion(s) of the adjacent one or ones of the first electrodes in the direction in which the first electrodes are arrayed has a length smaller than the other part of the first elongated portion of the first electrode which is not opposed to the first elongated portion(s) of the adjacent one or ones of the first electrodes in the direction in which the first electrodes are arrayed.

In the above semiconductor light emitting element having the above feature (ii), the external connection (around which current is likely to concentrate) of each of first electrodes formed in large part on the opposite side on the upper surface of the semiconductor layer is kept away from the tip of the first elongated portion extending from the external connection of the first electrode formed in large part on the opposite side on the upper surface of the semiconductor layer. Therefore, it is possible to relieve the concentration of current in the gap between the external connections of first electrodes formed in large part on the opposite side on the upper surface of the semiconductor layer and the first elongated portions of the first electrode formed in large part on the opposite side on the upper surface of the semiconductor layer.

(iii) In the semiconductor light emitting elements according to the first and second aspects of the present invention, the first elongated portion and the second elongated portion of each of the first electrodes have an identical dimension in a direction in which two side faces of the semiconductor layer are opposed.

In the above semiconductor light emitting elements having the above feature (iii), the external connections can be brought nearer to the central region of the semiconductor layer. Therefore, the external connections, around which current is likely to concentrate, can realize great compensation for the insufficiency of current in the central region of the semiconductor layer, and reduce the variations in the current density between the central region and the near-edge regions of the semiconductor layer.

(iv) In the semiconductor light emitting element according to the first aspect of the present invention, at least part of the first electrodes are connected to each other at predetermined positions of the at least part of the first electrodes, where the at least part of the first electrodes are not opposed to each other at the predetermined positions.

In the above semiconductor light emitting element having the above feature (iv), the connection between at least part of the first electrodes can realize further compensation for the insufficiency of current in the central region of the semiconductor layer, and reduce the variations in the current density between the central region and the near-edge regions of the semiconductor layer.

(v) In the semiconductor light emitting elements according to the first and second aspects of the present invention, the first elongated portion of each of the first electrodes branches at the external connection into two subportions each of which extends toward the central region.

In the above semiconductor light emitting elements having the above feature (v), the above structure having the branch into the two subportions increases the area of the electrodes, and spreads the current over a wider area of the semiconductor layer. Therefore, the insufficiency of current in the central region of the semiconductor layer can be further compensated for.

BRIEF DESCRIPTION OF THE DRAWINGS

FIG. 1A is a plan view of a semiconductor light emitting element according to a first embodiment of the present invention;

FIG. 1B is a plan view of one of first electrodes in the semiconductor light emitting element of FIG. 1A;

DETAILED DESCRIPTION

The semiconductor light emitting elements according to the first to twelfth embodiments of the present invention are explained below with reference to the accompanying drawings, in which the sizes of or positional relationships between some parts of the semiconductor light emitting elements may be exaggerated for clarification. In addition, in the following explanations, identical or equivalent elements or constituents may be indicated by the same denotations or similar reference numbers through the first to twelfth embodiments, and descriptions of the identical or equivalent elements or constituents are not repeated through the explanations on the first to twelfth embodiments unless necessary.

1. First Embodiment

The semiconductor light emitting element 10 according to the first embodiment is explained below with reference to FIGS. 1A, 1B, 2A, 2B, and 3.

1.1 Overall Structure

Figure 2A:
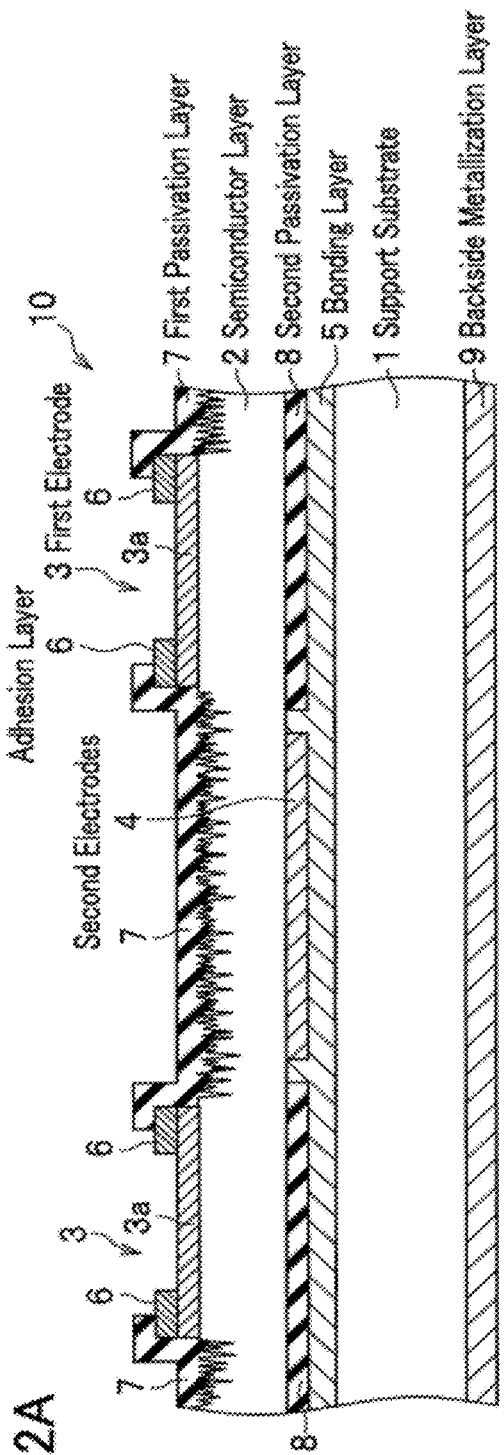
FIG. 2A is a cross-sectional view indicating the A-A cross section of the semiconductor light emitting element according to the first embodiment of the present invention.
Figure 2B:
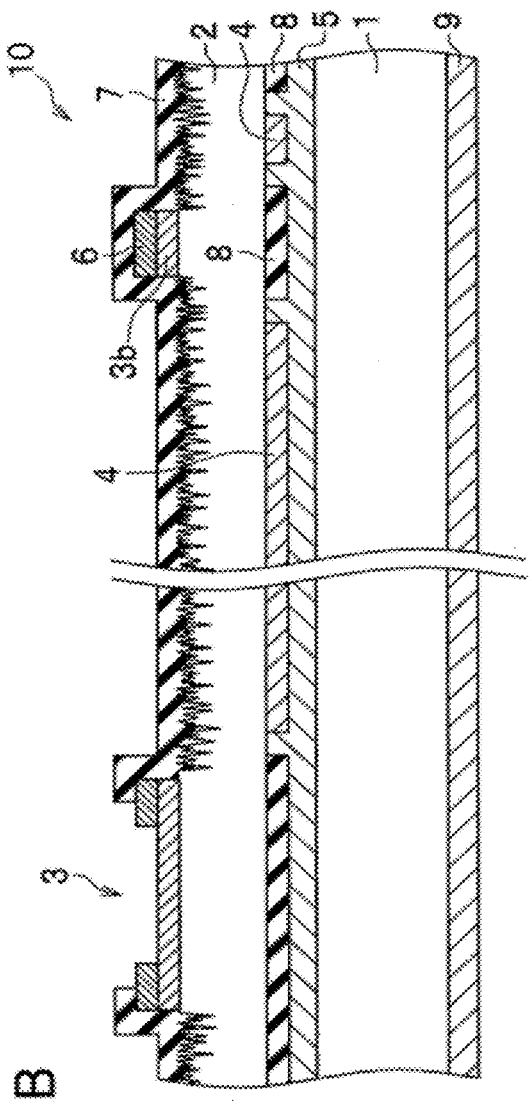
FIG. 2B is a cross-sectional view indicating the B-B cross section of the semiconductor light emitting element according to the first embodiment of the present invention.

The semiconductor light emitting element 10 according to the first embodiment is an element used in indicators, display devices, backlights for liquid crystal display devices, and the like. As illustrated in FIGS. 2A and 2B, the semiconductor light emitting element 10 has a laminated structure constituted by a support substrate 1, a semiconductor layer 2, a set of first electrodes 3, a set of second electrodes 4, a bonding layer 5, an adhesion layer 6, a first passivation layer 7, a second passivation layer 8, and a backside metallization layer 9. The semiconductor layer 2 is formed over the support substrate 1. The set of first electrodes 3 is formed on the upper surface of the semiconductor layer 2. The set of second electrodes 4 is formed on the lower surface of the semiconductor layer 2. The bonding layer 5 is formed for bonding the set of second electrodes 4 and the like to the support substrate 1. The adhesion layer 6 is formed on the set of first electrodes 3. The first passivation layer 7 is formed on the semiconductor layer 2, the set of first electrodes 3, and the adhesion layer 6. The second passivation layer 8 is formed in regions adjacent to the second electrodes 4. The backside metallization layer 9 is formed on the lower surface of the support substrate 1. In addition, the set of first electrodes 3 and the set of second electrodes 4 form a pair of positive and negative electrodes. That is, the semiconductor light emitting element 10 has an opposed-electrode structure in which the semiconductor layer 2 is sandwiched by the set of first electrodes 3 and the set of second electrodes 4. Hereinbelow, the respective constituents of the semiconductor light emitting element 10 are explained in detail.

1.2 Support Substrate

Figures 1A, 1B:
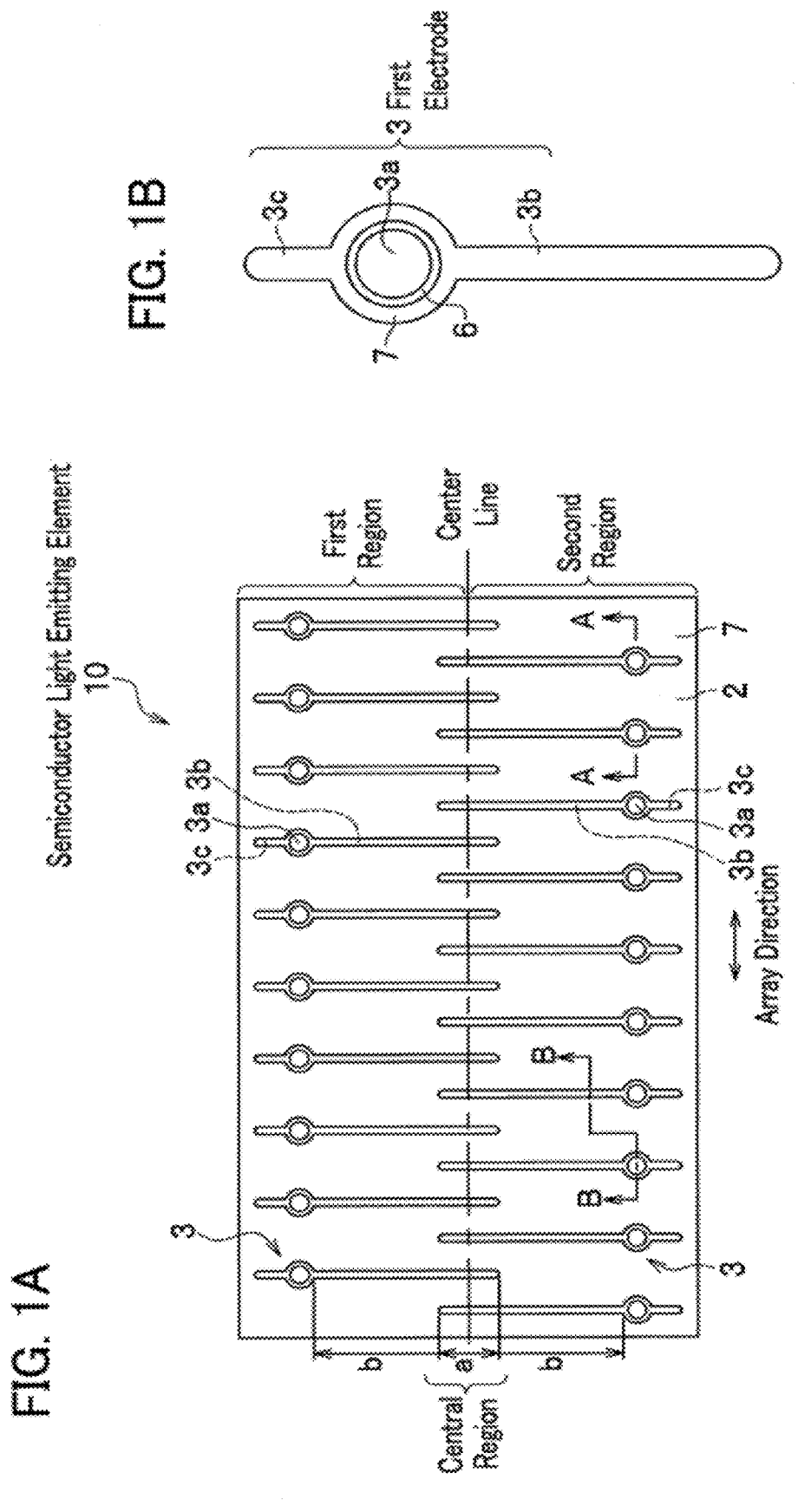

The support substrate 1 is provided for forming the lamination of the respective constituents including the electrodes and the semiconductor layer 2. As illustrated in FIGS. 1A, 2A, and 2B, the support substrate 1 is prepared in the form of a rectangular plate. The area of the support substrate 1 is not specifically limited, and is appropriately determined according to the dimensions and the number of the first electrodes 3 formed on the semiconductor layer 2 as explained later. The thickness of the support substrate 1 is not specifically limited. However, for example, from the viewpoint of the heat dissipation, it is preferable that the thickness of the support substrate 1 be 50 to 500 micrometers.

The support substrate 1 may be formed of a ceramic, a metal, a composite material, and a lamination of the ceramic, the metal, and/or the composite material. For example, the ceramic may be Si, SiC, or, AlN, the metal may be Cu—W or Cu—Mo, and the composite material may be Al—SiC or Cu-diamond. Use of Si is preferable because of inexpensiveness and ease of chip formation.

1.3 Semiconductor Layer

The semiconductor layer 2 forms a light emission part in the semiconductor light emitting element 10. As illustrated in FIGS. 2A and 2B, the semiconductor layer 2 is formed in the shape of a rectangular plate over substantially the entire support substrate 1 via the set of second electrodes 4, the second passivation layer 8, and the bonding layer 5. The area of the semiconductor layer 2 is not specifically limited, and is appropriately determined according to the area of the support substrate 1. The thickness of the semiconductor layer 2 is not specifically limited. However, for example, it is preferable that the thickness of the semiconductor layer 2 be 1 to 5 micrometers. Although not shown, the semiconductor layer 2 has a trilayer structure in which a light emission sublayer and a first semiconductor sublayer of a first conductive type are laminated in this order on a second semiconductor sublayer of a second conductive type. The structure of each of the first and second semiconductor sublayers and the light emission sublayer are briefly explained below.

1.3.1 First and Second Semiconductor Sublayers

The first and second semiconductor sublayers are respectively n-type and p-type (or p-type and n-type) semiconductor layers each of which is produced by doping a layer of a semiconductor material with a dopant. In the embodiment explained below, the first semiconductor is the uppermost sublayer and is n-type. The set of first electrodes 3 is a set of n-electrodes and is formed in contact with the upper surface of the first semiconductor sublayer. In addition, the second semiconductor sublayer is the lowermost sublayer and is p-type. The set of second electrodes 4 is a set of p-electrodes and is formed in contact with the lower surface of the second semiconductor sublayer.

For example, the first and second semiconductor sublayers may be formed of one of the following materials:

(a) GaN, AlN, InN, or III-V nitride semiconductors having the composition $In_\alpha Al_\beta Ga_{1-\alpha-\beta}N$ ($0 \leq \alpha$, $0 \leq \beta$, $\alpha+\beta \leq 1$) as mixed crystals of GaN, AlN, and InN (b) mixed crystals of a III-V nitride semiconductor in which all or part of the group III elements in the composition $In_\alpha Al_\beta Ga_{1-\alpha-\beta}N$ are substituted by B (c) mixed crystals of a III-V nitride semiconductor in which all or part of the group V element N in the composition $In_\alpha Al_\beta Ga_{1-\alpha-\beta}N$ is substituted by one or more of P, As, Sb, and the like (d) GaAs-based materials such as AlGaAs or InGaAs (e) InP-based materials such as AlGaInP (f) The other types of III-V compound semiconductors such as mixed crystals of the GaAs-based materials and the InP-based materials, e.g., InGaAsP The n-type dopant with which the above semiconductor material is doped for producing the first and second semiconductor sublayers may be one or more of IV or VI group elements including Si, Ge, Sn, S, O, Ti, and Zr, and the p-type dopants for producing the first and second semiconductor sublayers may be one or more of Be, Zn, Mn, Cr, Mg, Ca, and the like.

From the viewpoint of the capability of reducing the contact resistance with the set of first electrodes 3 or the set of second electrodes 4, it is preferable that the first and second semiconductor sublayers be respectively formed of GaN doped with Si and GaN doped with Mg.

As illustrated in FIGS. 2A and 2B, a wavelike uneven area is formed on the upper surface of the first semiconductor sublayer (i.e., the upper surface of the semiconductor layer 2). The uneven area (produced by dimple forming) is arranged on the light-exit side of the semiconductor layer 2, and enables change of the angle of the light in the semiconductor layer 2. Specifically, the uneven area formed on the upper side of the semiconductor layer 2 enables exit of the light from the semiconductor layer 2 where light would otherwise be unable to exit the semiconductor due to total reflection of the light. Therefore, the light output efficiency can be increased. From the viewpoint of appropriate increase in the light output efficiency, the depth in the uneven area is preferably 0.2 to 3.0 micrometers, and more preferably 1.0 to 1.5 micrometers.

1.3.2 Light Emission Sublayer

The light emission sublayer is provided for emission of light carrying the energy generated by recombination of electrons and positive holes which are injected from the first semiconductor sublayer (of the first conductive type, i.e., n-type) and the second semiconductor sublayer (of the second conductive type, i.e., p-type).

The light emission sublayer preferably has a quantum-well structure including a well sublayer and barrier sublayers. The light emission sublayer can be formed of an undoped semiconductor material, a semiconductor material doped with an n-type dopant, and/or p-type semiconductor material doped with a p-type dopant. It is preferable to use an undoped semiconductor material and/or a semiconductor material doped with an n-type dopant. For example, the well sublayer may be formed of an undoped semiconductor material, and the barrier sublayers may be formed of a semiconductor material doped with an n-type dopant.

The wavelength of the light generated in the light emission sublayer can be controlled according to the purpose, use or the like of the semiconductor light emitting element 10, by varying the composition of the well sublayer or selecting the doped amount and the type of the dopant with which the well sublayer is doped. For example, in the case where the light emission sublayer is formed of a nitride semiconductor, the light emission sublayer can emit light in the wavelength range of approximately 60 to 650 nm, and preferably in the wavelength range of 380 to 560 nm. In particular, in the case where Al is contained in the well sublayer, it is possible to obtain light in the wavelength range which cannot be obtained from the conventional InGaN well sublayer. Specifically, it is possible to obtain light having the wavelength of around 365 nm or shorter, where the wavelength of 365 nm corresponds to the bandgap energy of GaN.

1.4 First Electrodes

The set of first electrodes 3 is provided for supplying current to the semiconductor layer 2. The semiconductor light emitting element 10 has a pair of negative and positive electrodes, and the set of first electrodes 3 forms the negative electrode (n-electrode) in the present embodiment. As illustrated in FIG. 1A, the set of first electrodes 3 is formed on the upper surface of the semiconductor layer 2, and is opposed to the set of second electrodes 4 via the semiconductor layer 2 as illustrated in FIGS. 2A and 2B. The set of first electrodes 3 and the set of second electrodes 4 are opposed as a whole on a face-to-face basis, and not on a point-to-point basis.

The number and the areas of the first electrodes 3 are not specifically limited, and are appropriately determined according to the use and the area of the semiconductor light emitting element 10. In addition, the thicknesses of the first electrodes 3 are not specifically limited. However, for example, from the viewpoint of electric conductivity, it is preferable that the thicknesses of the first electrodes 3 be 0.1 to 1.5 micrometers. Further, the set of first electrodes 3 can be formed of one or more of Ni, Au, W, Pt, Ti, Al, and the like. It is preferable to use a multilayer film in which Ti, Pt, and Au are laminated in this order from the bottom.

1.4.1 Details of Structure of First Electrodes

As illustrated in FIG. 1B, each of the first electrodes 3 includes an external connection 3a having a round shape, a first elongated portion 3b having a linear shape and being relatively long, and a second elongated portion 3c having a linear shape and being relatively short. Details of the respective parts of each of the first electrodes 3 are explained below.

1.4.1.1 External Connection

The external connection 3a in each of the first electrodes 3 is a pad electrode for connection to an external power supply. As illustrated in FIG. 1A, the external connections 3a of the first electrodes 3 arrayed on the upper surface of the semiconductor layer 2 along two sides of the semiconductor layer 2 which are opposed to each other (and are illustrated as the top and bottom sides of the semiconductor layer 2 in FIG. 1A). Although the adhesion layer 6 and the first passivation layer 7 are formed on the external connections 3a as illustrated in FIGS. 1B, 2A, and 2B, each external connection 3a is formed to have a round opening, and a major portion of the upper surface of each external connection 3a is externally exposed. Thus, conductive wire can be bonded to the exposed surface of the external connection 3a, so that the set of first electrodes 3 can be electrically connected to the external power supply.

If the diameter of the exposed area of each external connection 3a (i.e., the diameter of the pad electrode) is too large, light is absorbed by the external connection 3a. Therefore, it is preferable that the diameter of the exposed area of each external connection 3a be as small as possible. Specifically, the diameter of the exposed area of each external connection 3a including the exposed area of the adhesion layer 6 (i.e., the diameter of the round opening in the first passivation layer 7 as illustrated in FIG. 1B) is preferably 50 to 200 micrometers, and more preferably 60 to 140 micrometers.

1.4.1.2 First Elongated Portion

The first elongated portion 3b in each of the first electrodes 3 is provided for spreading the current supplied to the external connection 3a, toward the central region of the upper surface of the semiconductor layer 2. As illustrated in FIG. 1A, the first elongated portion 3b extends from the external connection 3a toward the central region of the semiconductor layer 2. As illustrated in FIG. 1A, the central region is a region containing the center line of the upper surface of the semiconductor layer 2 and being located between the two opposed arrays of the external connections 3a on the upper surface of the semiconductor layer 2, where the center line of the upper surface of the semiconductor layer 2 is a line which equally divides the upper surface of the semiconductor layer 2. As illustrated in FIGS. 1B and 2B, the adhesion layer 6 and the first passivation layer 7 are formed over the first elongated portions 3b.

1.4.1.3 Second Elongated Portion

The second elongated portion 3c in each of the first electrodes 3 is provided for spreading the current supplied to the external connection 3a, toward one of the near-edge regions of the upper surface of the semiconductor layer 2. As illustrated in FIG. 1A, the second elongated portion 3c extends from the external connection 3a toward one of the two side faces of the semiconductor layer 2 (i.e., in the direction opposite to the first elongated portion 3b, which is the vertical direction in FIG. 1A). As illustrated in FIG. 1B, the adhesion layer 6 and the first passivation layer 7 are formed over the second elongated portions 3c.

As illustrated in FIG. 1A, the second elongated portions 3c are formed in the near-edge regions of the semiconductor layer 2, i.e., in the regions of the upper surface of the semiconductor layer 2 respectively located at a predetermined distance apart from the side faces of the semiconductor layer 2.

Since the second elongated portions 3c in each of the first electrodes 3 are arranged apart from the side faces of the semiconductor layer 2, it is possible to prevent concentration of current in the near-edge region of the semiconductor layer 2 and reduce the variations in the current density between the central region and the near-edge region of the semiconductor layer 2.

It is preferable that the width of each of the first elongated portions 3b and the second elongated portions 3c be in the range of 15 to 30 micrometers, and be adjusted according to the amount of current. For example, when the amount of current is great, increase in the widths of the first elongated portions 3b and the second elongated portions 3c makes the spread of the current easier. In the case where each of the first elongated portions 3b or each of the second elongated portions 3c branches as illustrated in FIGS. 11 to 14, the width of each of the first elongated portions 3b or each of the second elongated portions 3c may be reduced by half. Further, the sum of the lengths of the first elongated portion 3b and the second elongated portion 3c in each first electrode 3 is preferably 900 to 1500 micrometers.

1.4.2 Arrangement of First Electrodes

Details of the set of first electrodes 3 and the first elongated portions 3b are explained below. In the following explanations, for convenience of explanation, the upper surface of the semiconductor layer 2 is considered to be divided into the first and second regions by the center line.

As illustrated in FIG. 1A, the first electrode 3 are arrayed on the upper surface of the semiconductor layer 2 at regular intervals in a predetermined direction (the horizontal direction in FIG. 1A) perpendicular to the direction in which the set of first electrodes 3 is opposed to the set of second electrodes 4 (as illustrated in FIG. 2A). Specifically, a first half of the set of first electrodes 3 having the external connections located on the first region are arrayed in large part on the first region of the upper surface of the semiconductor layer 2, and a second half of the set of first electrodes 3 having the external connections located on the second region are arrayed in large part on the second region of the upper surface of the semiconductor layer 2, so that a staggered array of the first electrodes 3 is formed as illustrated in FIG. 1A. That is, the staggered array illustrated in FIG. 1A is formed by alternating the first elongated portions constituting the two comblike arrays respectively corresponding to the first and second halves of the set of first electrodes 3.

In addition, on the central region of the upper surface of the semiconductor layer 2, the set of first electrodes 3 are arranged so that a near-tip part of the first elongated portion 3b of each first electrode in the first half of the set of first electrodes 3 is opposed to a near-tip part of the first elongated portion 3b of each of one or more first electrodes in the second half of the set of first electrodes 3 which are located adjacent to the first electrode in the first half of the set of first electrodes 3 in the direction in which the first electrodes 3 are arrayed (in the horizontal direction in FIG. 1A). In other words, the near-tip parts of the first elongated portions 3b of the first half of the set of first electrodes 3 overlap the near-tip parts of the first elongated portions 3b of the second half of the set of first electrodes 3 in the direction in which the first electrodes 3 are arrayed (in the horizontal direction in FIG. 1A) on the central region of the semiconductor layer 2.

Although insufficiency of current is likely to occur in the central region of the semiconductor layer in the conventional semiconductor light emitting elements, the above arrangement of the near-tip parts of the first elongated portions 3b of the first electrodes 3 on the central region enables sufficient compensation for the insufficiency of current in the central region of the semiconductor layer 2. Although the near-tip parts of the first elongated portions 3b of the first electrodes 3 are arranged parallel to each other on the central region, the parallelism is not essential, and the near-tip parts may be arranged nonparallel on the central region.

Figure 3:
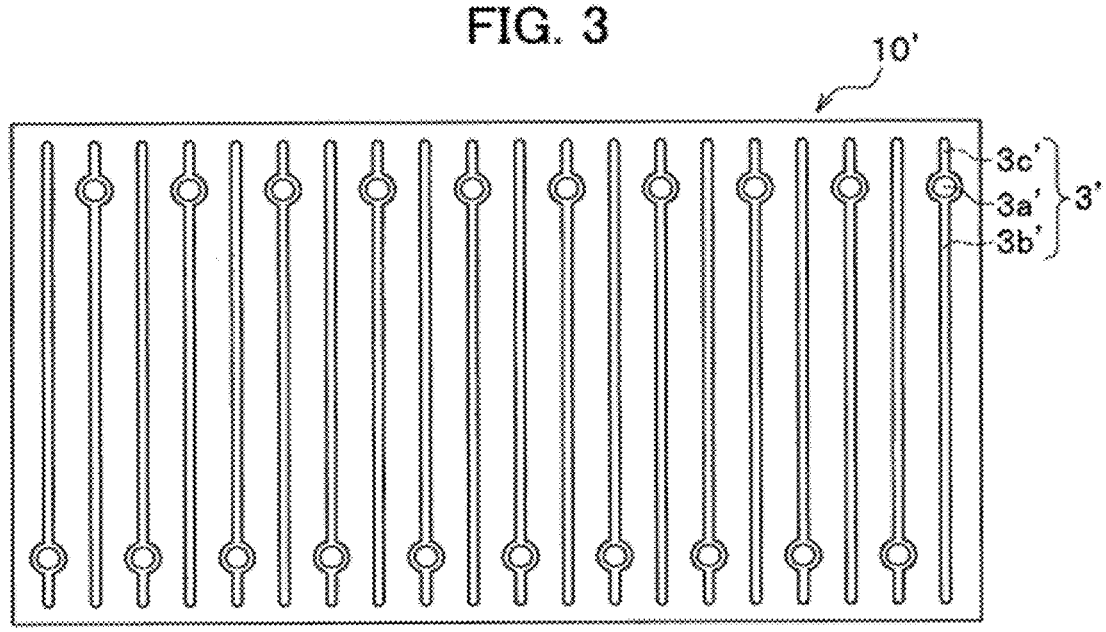
FIG. 3 is a plan view of an example of a semiconductor light emitting element with first electrodes respectively including first elongated portions in each of which the length of the part opposed to the first elongated portion(s) of the adjacent one or ones of the first electrodes is greater than the length of the other part of the first elongated portion not opposed to the first elongated portion(s) of the adjacent one or ones of the first electrodes.

As illustrated in FIG. 1A, the first elongated portions 3b of the first electrodes 3 formed in the staggered array on the upper surface of the semiconductor layer 2 are arranged in the region between the two arrays of the external connections 3a respectively arrayed along the two opposed sides of the semiconductor layer 2. In addition, the first elongated portions 3b of the first half of the set of first electrodes 3 (which have the external connections formed on the first region of the upper surface of the semiconductor layer 2 and are arranged in large part on the first region) are not extended to the vicinities of the external connections 3a of the second half of the set of first electrodes 3 (which have the external connections formed on the second region of the upper surface of the semiconductor layer 2 and are arranged in large part on the second region), and the first elongated portions 3b of the second half of the set of first electrodes 3 (which have the external connections formed on the second region of the upper surface of the semiconductor layer 2 and are arranged in large part on the second region) are not extended to the vicinities of the external connections 3a of the first half of the set of first electrodes 3 (which have the external connections formed on the first region of the upper surface of the semiconductor layer 2 and are arranged in large part on the first region). In order to explain the reason for the above arrangement, an example of a semiconductor light emitting element 10' having an arrangement of the first elongated portions 3b' of the first electrodes 3' which is different from the above arrangement of the first elongated portions 3b of the first electrodes 3 in the present embodiment is illustrated in FIG. 3. That is, in the semiconductor light emitting element 10' of FIG. 3, the first elongated portions 3b' of the first half of the set of first electrodes 3' (which have the external connections formed on the first region of the upper surface of the semiconductor layer 2) are extended to the vicinities of the external connections 3a' of the second half of the set of first electrodes 3' (which have the external connections formed on the second region of the upper surface of the semiconductor layer 2), and the first elongated portions 3b' of the second half of the set of first electrodes 3' (which have the external connections formed on the second region of the upper surface of the semiconductor layer 2) are extended to the vicinities of the external connections 3a' of the first half of the set of first electrodes 3' (which have the external connections formed on the first region of the upper surface of the semiconductor layer 2). In the arrangement of the first elongated portions 3b' of the first electrodes 3' illustrated in FIG. 3, the concentration of current can be enhanced in the regions between the external connections 3a' in each of the first and second regions and the first elongated portions 3b' extending from the external connections 3a' in the other of the first and second regions.

Further, it is preferable that, as illustrated in FIG. 1A, the length a, in the direction in which the two side faces are opposed (in the vertical direction in FIG. 1A), of the near-tip part of the first elongated portion 3b of each of the first electrodes 3 which is opposed to the near-tip part(s) of the first elongated portion(s) of the adjacent one or ones of the first electrodes in the direction in which the first electrodes are arrayed be smaller than the length b, in the direction in which the two side faces are opposed (in the vertical direction in FIG. 1A), of the other part of the first elongated portion of the first electrode which is not opposed to the first elongated portion(s) of the adjacent one or ones of the first electrodes in the direction in which the first electrodes are arrayed (in the horizontal direction in FIG. 1A). In other words, it is preferable that, for example, the length a, in the direction in which the two side faces of the semiconductor layer 2 are opposed (in the vertical direction in FIG. 1A), of each of the near-tip parts of the first elongated portions 3b of the aforementioned first half of the set of first electrodes 3 which overlap the near-tip parts of the first elongated portions 3b of the aforementioned second half of the set of first electrodes 3 in the direction in which the first electrodes are arrayed be smaller than the length b, in the direction in which the two side faces are opposed (in the vertical direction in FIG. 1A), of each of the other parts of the first elongated portions 3b of the first half of the set of first electrodes 3.

When the above condition that the length a is smaller than the length b is satisfied, the tips of the first elongated portions 3b extending from the external connections 3a formed on each of the first and second regions is apart from the external connections 3a formed on the other of the first and second regions. Therefore, it is possible to relieve the concentration of current in the region between the first elongated portions 3b extending from the external connections 3a located on each of the first and second regions and the external connections 3a located on the other of the first and second regions.

1.5 Second Electrodes

The set of second electrodes 4 is provided for supplying current to the semiconductor layer 2. The semiconductor light emitting element 10 has the pair of negative and positive electrodes, and the set of second electrodes 4 forms the positive electrode (p-electrode) in the present embodiment. As illustrated in FIGS. 2A and 2B, the set of second electrodes 4 is formed on the lower surface of the semiconductor layer 2, and is opposed to the set of first electrodes 3 via the semiconductor layer 2 as illustrated in FIGS. 2A and 2B.

Specifically, the second electrodes 4 are formed on the support substrate 1 through the bonding layer 5 as illustrated in FIGS. 2A and 2B. The areas of the second electrodes 4 are preferably such that none of the first electrodes 3 is formed over the second electrodes 4. Since the first electrodes 3 and the second electrodes 4 are arranged in the above positional relationship, current between the first electrodes 3 and the second electrodes 4 does not flow through the shortest path in the semiconductor layer 2 perpendicular to the film surfaces, so that the current spreads to a wide region in the semiconductor layer 2. Therefore, the light emission becomes relatively uniform over the semiconductor layer 2, and the light output efficiency is increased.

Further, it is preferable that the area of the set of second electrodes 4 be greater than the area of the first electrodes 3. In the case where the area of the set of second electrodes 4 and the area of the first electrodes 3 are in this relationship, it is possible to increase the area of the current injection region and the light emission efficiency. Furthermore, it is also possible to improve the performance of the semiconductor light emitting element 10 in dissipating the heat generated when the light is emitted. That is, the heat dissipation characteristics of the semiconductor light emitting element 10 can be improved.

Although the thicknesses of the second electrodes 4 are not specifically limited, for example, from the viewpoint of electric conductivity, it is preferable that the thicknesses of the second electrodes 4 be 0.05 to 0.5 micrometers. Further, the set of second electrodes 4 can be formed of one or more of Ni, Au, W, Pt, Ti, Al, Ir, Rh, RhO, Ag, and the like. It is preferable to use a film of Rh, Ag, Ni, or Au, or a multilayer film in which Pt, Ti, Ni, and Ag are laminated in this order from the bottom, which exhibit high reflectance.

1.6 Contact Layer

The bonding layer 5 is a conductive layer for bonding the second electrodes 4 and the second passivation layer 8 (explained later) to the support substrate 1, and electrically connecting the second electrodes 4 and the backside metallization layer 9 (explained later) through the support substrate 1. As illustrated in FIGS. 2A and 2B, the bonding layer 5 is formed over the entire upper surface of the support substrate 1.

Although the thickness of the bonding layer 5 is not specifically limited, for example, from the viewpoint of bondability and electric conductivity, it is preferable that the thicknesses of the bonding layer 5 be 3 to 4 micrometers. Further, the bonding layer 5 can contain at least one low melting point material such as Sn or Pb, and be formed of one or an alloy of the metals of Ti, Pt, Au, Sn, Ag, Cu, Bi, Pb, Zn, and the like. It is preferable to use a multilayer film in which $TiSi_2$, Pt, Au, AuSn, Au, and Pt are laminated in this order from the bottom.

1.7 Adhesion Layer

The adhesion layer 6 is provided for improving the adhesiveness of the first passivation layer 7 (explained later) to the first electrodes 3. As illustrated in FIGS. 1B, 2A, and 2B, the adhesion layer 6 is formed over the entire first electrodes 3 except that the adhesion layer 6 has a round opening on each external connection 3a so that a major part of the external connection 3a is externally exposed.

The area of the adhesion layer 6 is not specifically limited, and is appropriately determined according to the area of the support substrate 1. The thickness of the adhesion layer 6 is not specifically limited. However, for example, from the viewpoint of adhesiveness, it is preferable that the thickness of the adhesion layer 6 be 0.2 to 0.3 micrometers. Further, the adhesion layer 6 can be formed of one or more of Ti, Pt, Ni, W, Mo, and the like. It is preferable to use a multilayer film in which Pt and Ti are laminated in this order from the bottom.

1.8 First Passivation Layer

The first passivation layer 7 is provided for protecting the first electrodes 3 and the semiconductor layer 2 from physical damage such as a short circuit or dust deposition. As illustrated in FIGS. 1B, 2A, and 2B, the first passivation layer 7 is formed over the first electrodes 3 and the semiconductor layer 2 except that the first passivation layer 7 has a round opening on each external connection 3a and the aforementioned opening of the adhesion layer 6 so that a part of the adhesion layer 6 and the major part of the external connection 3a are externally exposed.

A wavelike uneven area is formed on the lower surface of the first passivation layer 7 in correspondence with the aforementioned wavelike uneven area formed on the upper surface of semiconductor layer 2 as illustrated in FIGS. 2A and 2B. The area of the first passivation layer 7 is not specifically limited, and is appropriately determined according to the area of the support substrate 1. Although the thickness of the first passivation layer 7 is not specifically limited, for example, it is preferable that the thickness of the first passivation layer 7 be 0.2 to 0.3 micrometers. Further, preferably, the first passivation layer 7 can be formed of $SiO_2$.

1.9 Second Passivation Layer

The second passivation layer 8 is provided for protecting the second electrodes 4 and the semiconductor layer 2 from physical damage such as a short circuit. As illustrated in FIGS. 2A and 2B, the second passivation layer 8 is formed in regions adjacent to the second electrodes 4 on the bonding layer 5.

The area of the second passivation layer 8 is not specifically limited, and is appropriately determined according to the areas of the second electrodes 4. Although the thickness of the second passivation layer 8 is not specifically limited, for example, it is preferable that the thickness of the second passivation layer 8 be 0.2 to 0.3 micrometers. Further, the first passivation layer 7 can be formed of one or more of Ti, Al, $SiO_2$, $ZrO_2$, and the like. It is preferable to use a multilayer film in which Ti and $SiO_2$ are laminated in this order from the bottom.

Further, a metal film in which Ti and Pt are laminated in this order from the bottom and which exhibits high reflectance may be formed under the second passivation layer 8 (i.e., on the bonding layer 5 side). In the case where the metal film exhibiting high reflectance is formed on the lower surface of the second passivation layer 8, it is possible to increase the reflectance and the light output efficiency.

1.10 Backside Metallization Layer

The backside metallization layer 9 is a layer having a function of an ohmic electrode. As illustrated in FIGS. 2A and 2B, the backside metallization layer 9 is formed on the side of the support substrate 1 opposite to the bonding layer 5, and specifically, on the entire lower surface of the support substrate 1.

The thickness of the backside metallization layer 9 is not specifically limited. However, for example, from the viewpoint of electric conductivity, it is preferable that the thickness of the backside metallization layer 9 be 0.5 to 0.6 micrometers. Further, it is preferable that the backside metallization layer 9 be formed by a multilayer film in which Au, AuSn, Pt, and $TiSi_2$ are laminated in this order from the bottom.

1.11 Operation of First Embodiment

The operation of the semiconductor light emitting element 10 is briefly explained below.

When current is supplied to the light emission sublayer in the semiconductor layer 2 through the first electrodes 3 and the second electrodes 4, electrons and positive holes injected from the first and second semiconductor sublayers are recombined to generate energy in the form of light, so that the light emission sublayer emits the light. The light emitted from the light emission sublayer propagates through the semiconductor layer 2, and is emitted from the semiconductor light emitting element 10 (from the upper side illustrated in FIGS. 2A and 2B). At this time, light propagates to the second passivation layer 8 and is reflected upward (in FIGS. 2A and 2B) by the second passivation layer 8. In addition, since the angle of the light propagating in the semiconductor layer 2 can be changed by the uneven area, light that would otherwise be unable to exit the semiconductor layer 2 because of the total reflection can be emitted from the semiconductor layer 2 due to the uneven area.

In the semiconductor light emitting element 10, the first elongated portions 3b of the first electrodes 3 spread the current toward the central region of the semiconductor layer 2, and the second elongated portions 3c spread the current toward the near-edge regions of the semiconductor layer 2. In addition, the near-tip parts of the first elongated portions 3b of the first and second halves of the first electrodes 3 overlap in the direction of the array of the first electrodes 3 (in the horizontal direction in FIG. 1A) on the central region of the first electrodes 3, so that the insufficiency of current in the central region of the semiconductor layer 2 can be sufficiently compensated for, although the insufficiency of current is particularly likely to occur in the central region of the semiconductor layer 2. Thus, the current density in the semiconductor layer 2 between the first and second electrodes is homogenized, so that the distribution of light emission over the entire semiconductor light emitting element 10 becomes uniform, and light emission without unevenness is enabled.

1.12 Advantages of First Embodiment

As explained above, in the above semiconductor light emitting element 10 according to the first embodiment, each of the first electrodes 3 has the first elongated portions 3b and the second elongated portions 3c. Therefore, it is possible to spread the current over the entire semiconductor layer including the near-edge region and the central region, i.e., relieve the concentration of current, which is likely to occur around the external connections 3a. In addition, since the near-tip parts of the first elongated portions 3b of the first half of the set of first electrodes 3 overlap the near-tip parts of the first elongated portions 3b of the second half of the set of first electrodes 3 in the direction in which the first electrodes 3 are arrayed (in the horizontal direction in FIG. 1A) on the central region of the semiconductor layer 2, it is possible to sufficiently compensate for the insufficiency of current in the central region of the semiconductor layer 2, although the insufficiency of current is particularly likely to occur in the central region of the semiconductor layer 2. Thus, the current density in the semiconductor layer 2 between the first electrodes 3 and the second electrodes 4 can be homogenized, so that the distribution of light emission over the entire semiconductor light emitting element can be improved.

1.13 Production Process of Semiconductor Light Emitting Element

Hereinbelow, a process for producing the semiconductor light emitting element 10 according to the first embodiment of the present invention is explained. The process includes a first step for forming the semiconductor layer 2, a second step for forming the second electrodes 4, a third step for forming the second passivation layer 8, a fourth step for forming the bonding layer 5, a fifth step for bonding, a sixth step for forming the first electrodes 3, and a seventh step for forming the first passivation layer 7. Details of the respective steps are explained below, where the explanations on the structure of the semiconductor light emitting element 10 are not repeated.

1.13.1 Step for Forming Semiconductor Layer

In the first step, the semiconductor layer 2 constituted by the first semiconductor sublayer (of the first conductive type), the light emission sublayer, and the second semiconductor sublayer (of the second conductive type) are formed on a heterosubstrate to make up the semiconductor layer 2. Specifically, in the first step, the first semiconductor sublayer, the light emission sublayer, and the second semiconductor sublayer are formed in this order by vapor deposition on a surface of a cleaned heterosubstrate of sapphire or the like by using a vapor phase deposition apparatus for MOVPE (Metal Organic Vapor Phase Epitaxy), HVPE (Hydride Vapor Phase Epitaxy), MBE (Molecular Beam Epitaxy), MOMBE (Metal Organic Molecular Beam Epitaxy), or the like and supplying gas containing predetermined semiconductor materials, dopants, and the like onto the surface of the heterosubstrate. For example, the types and compositions of the semiconductor materials and the dopants contained in the supplied gas are switched according to the layer structures and the constituents of the first semiconductor sublayer, the light emission sublayer, and the second semiconductor sublayer, the thicknesses of the layers, and the like, and inert gas such as nitrogen gas is used as carrier gas and supplied to the upper side of the heterosubstrate.

1.13.2 Step for Forming Second Electrodes

In the second step, the second electrodes 4 are formed on the semiconductor layer 2. Specifically, a mask corresponding to the second electrodes 4 is formed on the surface of the semiconductor layer 2 by using resist, and then the second electrodes 4 are formed by depositing an electrode material by sputtering or the like.

1.13.3 Step for Forming Second Passivation Layer

In the third step, the second passivation layer 8 is formed on the semiconductor layer 2. Specifically, a mask corresponding to the second passivation layer 8 is formed on the surface of the semiconductor layer 2 (i.e., on the second semiconductor sublayer of the second conductive type) by using resist, and then the second passivation layer 8 is formed by depositing a material for an insulation film by sputtering or the like.

1.13.4 Step for Forming Bonding Layer

In the fourth step, the bonding layer 5 is formed over the semiconductor layer 2, the second electrodes 4, and the second passivation layer 8. Specifically, the bonding layer 5 is formed by depositing a material for an electrically conductive film, over the semiconductor layer 2, the second electrodes 4, and the second passivation layer 8 by sputtering or the like.

1.13.5 Step for Bonding

In the fifth step, the heterosubstrate on which the first to fourth steps are performed is bonded to the support substrate 1. Specifically, the bonding layer 5 is formed on a surface of the support substrate 1 in advance. Then, the bonding layer 5 on the heterosubstrate and the bonding layer 5 on the support substrate 1 are put together and heated, so that the support substrate 1 and the heterosubstrate having the semiconductor layer 2, the second electrodes 4, and the second passivation layer 8 are bonded through the bonding layers 5. Thereafter, the heterosubstrate is removed by irradiation of the heterosubstrate with excimer laser, grinding, or the like, and the surface of the first semiconductor sublayer which is exposed by the removal of the heterosubstrate is polished by CMP (Chemical Mechanical Polishing).

1.13.6 Step for Forming First Electrodes

In the sixth step, the first electrodes 3 are formed on the semiconductor layer 2. Specifically, a mask corresponding to the first electrodes 3 is formed on the exposed surface of the semiconductor layer 2 by using resist, and then the first electrodes 3 are formed by depositing an electrode material by sputtering or the like. Thereafter, the resist is removed, so that areas of the semiconductor layer 2 on which the first electrodes 3 are not formed are exposed.

1.13.7 Step for Forming Adhesion Layer

In the seventh step, the adhesion layer 6 is formed on the first electrodes 3. Specifically, the adhesion layer 6 is formed by depositing a material for an electrically conductive film by sputtering or the like. Thereafter, regions of the adhesion layer 6 corresponding to the external connections 3a are removed by RIE (Reactive Ion Etching) or the like so that the major part of each external connection 3a (i.e., the surface of each external connection 3a except for the marginal part) is exposed, and then the resist is removed.

1.13.8 Step for Forming First Passivation Layer

In the eighth step, the first passivation layer 7 is formed over the semiconductor layer 2 and the adhesion layer 6. Specifically, the first passivation layer 7 is formed by depositing a material for an insulation film, by sputtering or the like, over the semiconductor layer 2 and the adhesion layer 6. Thereafter, regions of the first passivation layer 7 corresponding to the external connections 3a are removed by RIE or the like so that the major part of each external connection 3a is exposed. Further, before the formation of the first passivation layer 7, it is possible to form the uneven area (by dimple processing) on the upper surface of the semiconductor layer 2.

2. Second Embodiment

Figure 4:
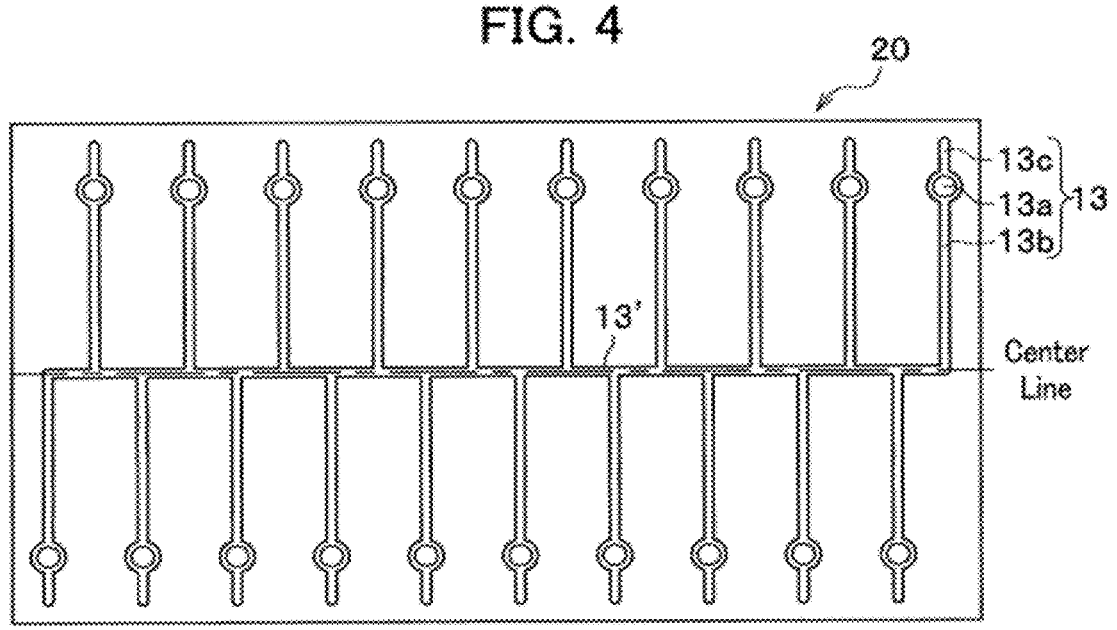
FIG. 4 is a plan view of a semiconductor light emitting element according to a second embodiment of the present invention.

The semiconductor light emitting element 20 according to the second embodiment is explained below with reference to FIG. 4. The semiconductor light emitting element 20 according to the second embodiment has a structure similar to the semiconductor light emitting element 10 according to the first embodiment except for the arrangement of the first electrodes and connection of the first electrodes, which are illustrated in FIG. 4. Therefore, in the following explanations on the second embodiment, structures identical or equivalent to the semiconductor light emitting element 10 according to the first embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 20 according to the second embodiment are similar to the first embodiment, the descriptions of the cross-sectional structure and the production process are not repeated.

The semiconductor light emitting element 20 has first electrodes 13 instead of the first electrodes 3, and each of the first electrodes 13 in the semiconductor light emitting element 20 has an external connection 13a, a first elongated portion 13b, and a second elongated portion 13c which are respectively similar to the external connection 3a, the first elongated portion 3b, and the second elongated portion 3c in the first electrodes 3 in the first embodiment. However, as illustrated in FIG. 4, the ends of the first elongated portions 13b of the first electrodes 13 (including both of the first half of the set of first electrodes which are formed in large part on the aforementioned first region of the upper surface of the semiconductor layer 2 and the second half of the set of first electrodes which are formed in large part on the aforementioned second region of the upper surface of the semiconductor layer 2) are connected on the central region of the upper surface of the semiconductor layer 2 through a traverse electrode 13'. The traverse electrode 13' is formed on the center line of the semiconductor layer 2. The traverse electrode 13' can be formed in the same manner as the first electrodes 13.

Since the first elongated portions 13b of the first electrodes 13 are connected through the traverse electrode 13' on the central region of the semiconductor layer 2, it is possible to sufficiently compensate for the insufficiency of current in the central region of the semiconductor layer 2, although the insufficiency of current is particularly likely to occur in the central region of the semiconductor layer 2.

3. Third Embodiment

Figure 5:
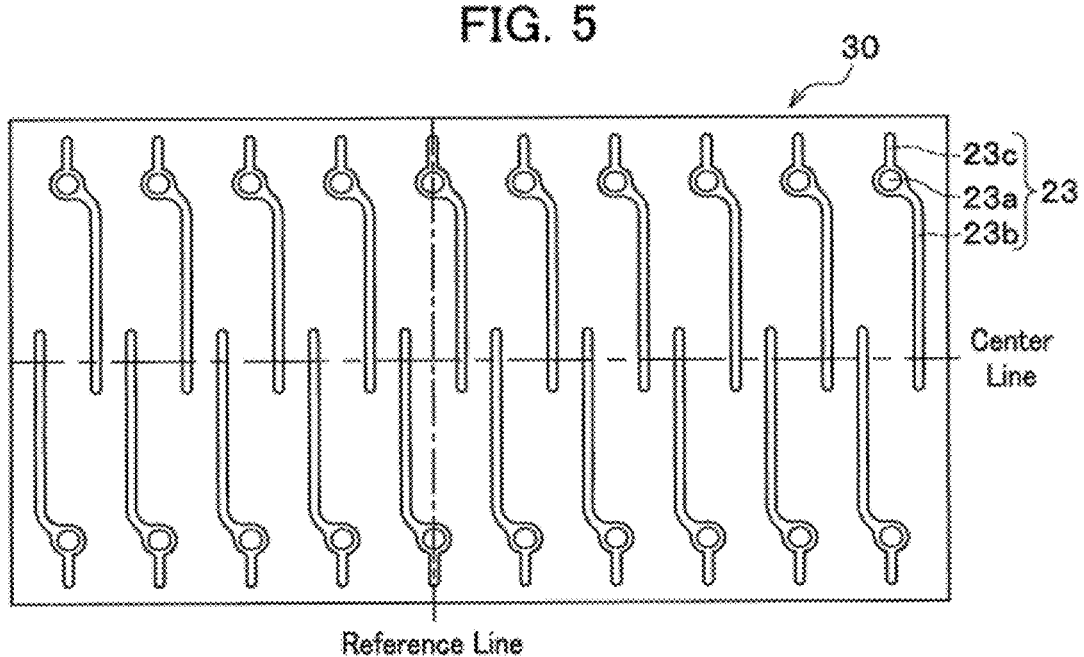
FIG. 5 is a plan view of a semiconductor light emitting element according to a third embodiment of the present invention.

The semiconductor light emitting element 30 according to the third embodiment is explained below with reference to FIG. 5. The semiconductor light emitting element 30 according to the third embodiment has a structure similar to the semiconductor light emitting element 10 according to the first embodiment except for the arrangement of the first electrodes, which is illustrated in FIG. 5. Therefore, in the following explanations on the third embodiment, structures identical or equivalent to the semiconductor light emitting element 10 according to the first embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 30 according to the third embodiment are similar to the first embodiment, the descriptions of the cross-sectional structure and the production process are not repeated.

The semiconductor light emitting element 30 has first electrodes 23 instead of the first electrodes 3, and each of the first electrodes 23 in the semiconductor light emitting element 30 has an external connection 23a, a first elongated portion 23b, and a second elongated portion 23c which are respectively similar to the external connection 3a, the first elongated portion 3b, and the second elongated portion 3c in the first electrodes 3 in the first embodiment. However, as illustrated in FIG. 5, in the semiconductor light emitting element 30, each of the external connections 23a located on the aforementioned first region of the upper surface of the semiconductor layer 2 and one of the external connections 23a located on the aforementioned second region of the upper surface of the semiconductor layer 2 and opposed to the external connection 23a on the aforementioned first region are on a straight line (as a reference line) in a first direction in which the two side faces of the semiconductor layer 2 are opposed to each other (i.e., in the vertical direction in FIG. 5). In other words, the external connections 23a located on the first region of the upper surface of the semiconductor layer 2 and the external connections 23a located on the second region of the upper surface of the semiconductor layer 2 are symmetrically arranged with respect to the center line of the upper surface of the semiconductor layer 2. Thus, although current is likely to concentrate around the external connections 23a, the external connections 23a of the first electrodes 23 are arranged in balance (at regular intervals) on the semiconductor layer 2.

In addition, a first part of each first elongated portion 23b extends from the corresponding external connection 23a in a second direction which is oblique to the above-mentioned reference line (the straight line connecting the opposed external connection 23a as illustrated in FIG. 5).

Further, a second part of the first elongated portion 23b other than the first part extends from the above part of the first elongated portion 23b in the direction parallel to the reference line.

In the semiconductor light emitting element 30 having the above structure, the external connections 23a opposed to each other on the semiconductor layer 2 in the first direction (in which the two side faces of the semiconductor layer 2 are opposed to each other) are arranged on a straight line (the reference line). Therefore, it is possible to regularize the distances from the side faces of the semiconductor layer to the external connections, and thus relieve the concentration of current or the insufficiency of current in the gap between the external connections and the side faces of the semiconductor layer. In addition, since the first elongated portion curves along predetermined directions, the area of the electrodes increases, and the current can be spread over a wider area.

4. Fourth Embodiment

Figure 6:
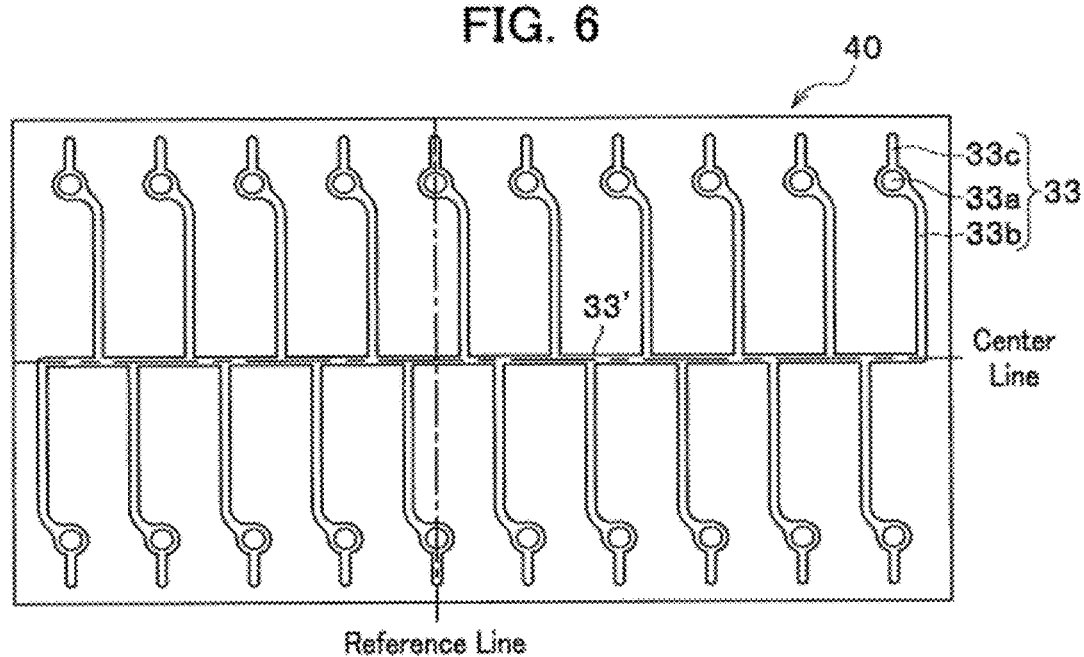
FIG. 6 is a plan view of a semiconductor light emitting element according to a fourth embodiment of the present invention.

The semiconductor light emitting element 40 according to the fourth embodiment is explained below with reference to FIG. 6. The semiconductor light emitting element 40 according to the fourth embodiment has a structure similar to the semiconductor light emitting element 30 according to the third embodiment except for the arrangement of the first electrodes and connection of the first electrodes, which are illustrated in FIG. 6. Therefore, in the following explanations on the fourth embodiment, structures identical or equivalent to the semiconductor light emitting element 30 according to the third embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 40 according to the fourth embodiment are similar to the first embodiment, the descriptions of the cross-sectional structure and the production process are not repeated.

The semiconductor light emitting element 40 has first electrodes 33 instead of the first electrodes 23, and each of the first electrodes 33 in the semiconductor light emitting element 40 has an external connection 33a, a first elongated portion 33b, and a second elongated portion 33c which are respectively similar to the external connection 23a, the first elongated portion 23b, and the second elongated portion 23c in the first electrodes 23 in the third embodiment. However, as illustrated in FIG. 6, the ends of the first elongated portions 33b of the first electrodes 33 (including both of the aforementioned first half of the set of first electrodes which are formed in large part on the aforementioned first region of the upper surface of the semiconductor layer 2 and the aforementioned second half of the set of first electrodes which are formed in large part on the aforementioned second region of the upper surface of the semiconductor layer 2) are connected on the central region of the upper surface of the semiconductor layer 2 through a traverse electrode 33'. The traverse electrode 33' is formed on the center line of the semiconductor layer 2 in the same manner as the first electrodes 33.

Since the first elongated portions 33b of the first electrodes 33 are connected through the traverse electrode 33' on the central region of the semiconductor layer 2, it is possible to sufficiently compensate for the insufficiency of current in the central region of the semiconductor layer 2, although the insufficiency of current is particularly likely to occur in the central region of the semiconductor layer 2.

5. Fifth Embodiment

Figure 7:
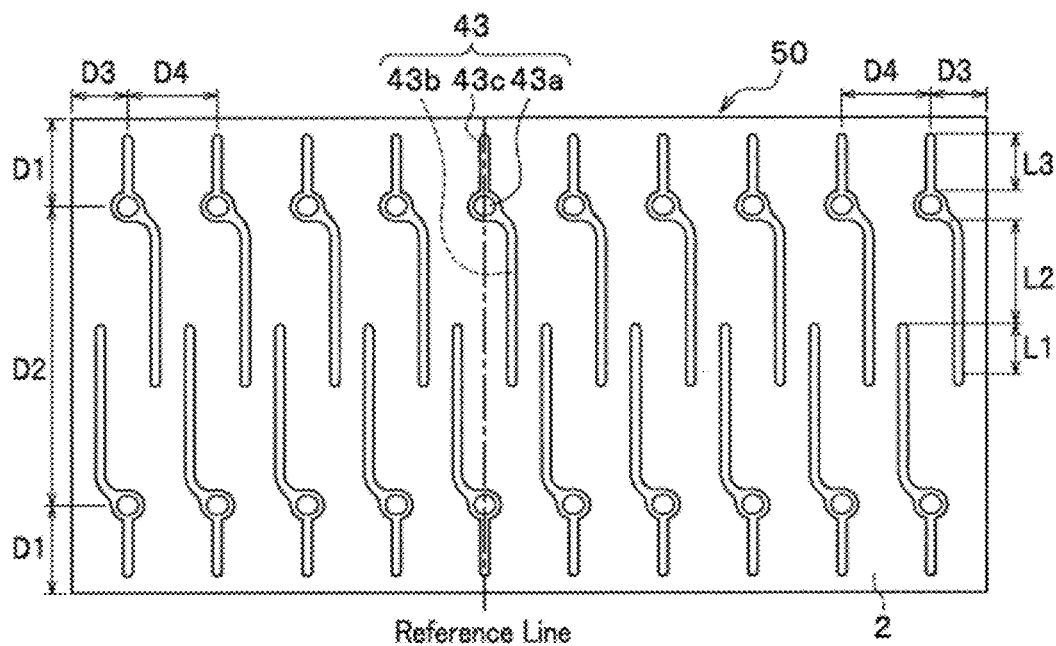
FIG. 7 is a plan view of a semiconductor light emitting element according to a fifth embodiment of the present invention.

The semiconductor light emitting element 50 according to the fifth embodiment is explained below with reference to FIG. 7. The semiconductor light emitting element 50 according to the fifth embodiment has a structure similar to the semiconductor light emitting element 30 according to the third embodiment except for the arrangement of the first electrodes, which is illustrated in FIG. 7. Therefore, in the following explanations on the fifth embodiment, structures identical or equivalent to the semiconductor light emitting element 30 according to the third embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 50 according to the fifth embodiment are similar to the first embodiment, the descriptions of the cross-sectional structure and the production process are not repeated.

The semiconductor light emitting element 50 has first electrodes 43 instead of the first electrodes 23, and each of the first electrodes 43 in the semiconductor light emitting element 50 has an external connection 43a, a first elongated portion 43b, and a second elongated portion 43c which are respectively similar to the external connection 23a, the first elongated portion 23b, and the second elongated portion 23c in the first electrodes 23 in the third embodiment. However, as illustrated in FIG. 7, the semiconductor light emitting element 50 according to the fifth embodiment is different from the semiconductor light emitting element 30 according to the third embodiment in that the positions of the external connections 43a (around which the current is likely to concentrate) are nearer to the central region of the semiconductor layer 2 than the positions of the external connection 23a. That is, the positions of the external connections 43a are shifted toward the central region from the positions of the external connection 23a.

Since the positions of the external connections 43a are brought nearer to the central region of the semiconductor layer 2, and the current tends to concentrate around the external connections 43a at the positions, it is possible to compensate for the insufficiency of current in the central region of the semiconductor layer 2, and reduce the variations in the current density between the sides and the central region of the semiconductor layer 2.

In the case where the external connections 43a are still arranged at positions relatively far from the central region of the semiconductor layer 2 (i.e., at positions relatively near to one of the opposed side faces of the semiconductor layer 2 along which the external connections 43a are arrayed and which are illustrated at the upper and lower edges of the semiconductor layer 2 in the plan view of FIG. 7) as in the semiconductor light emitting element 50 according to the fifth embodiment, the ratio of the first distance D1 to the second distance D2 is preferably 1:1 to 1:2.5, and more preferably 1:2.5, where the first distance D1 is the distance from the upper side face (illustrated in the plan view of FIG. 7) to the center of each of the external connections 43a arranged in the aforementioned first region (i.e., the upper half of the semiconductor layer 2 illustrated in the plan view of FIG. 7) or the distance from the lower side face (illustrated in the plan view of FIG. 7) to the center of each of the external connections 43a arranged in the aforementioned second region (i.e., the lower half of the semiconductor layer 2 illustrated in the plan view of FIG. 7), and the second distance D2 is the distance from the center of each of the external connections 43a arranged in the first region to the center of one of the external connections 43a arranged in the direction of the aforementioned reference line in the second region. When the ratio between the distances D1 and D2 satisfies the above condition, it is possible to achieve reduction of the wire loops connecting the external connections 43a and the external power supply, as well as improvement in the mountability of the semiconductor light emitting element 50. Therefore, light absorption by the wiring and hindrance to the light output can be suppressed.

In addition, in the case where the external connection 43a in the leftmost one (in the plan view of FIG. 7) of the first electrodes 43 in the semiconductor layer 2 is arranged near to the left side face (in the plan view of FIG. 7) of the semiconductor layer 2, the ratio of the third distance D3 to the fourth distance D4 is preferably 1:1 to 1:1.5, where the third distance D3 is the distance from the left side face to the center of the external connection 43a in the leftmost one of the first electrodes 43 or the distance from the right side face to the center of the external connection 43a in the rightmost one of the first electrodes 43, and the fourth distance D4 is the distance from the center of the external connection 43a in the leftmost one of the first electrodes 43 to the center of the external connection 43a in the one of the first electrodes 43 located right and adjacent to the leftmost one of the first electrodes 43 or the distance from the center of the external connection 43a in the rightmost one of the first electrodes 43 to the center of the external connection 43a in the one of the first electrodes 43 located left and adjacent to the rightmost one of the first electrodes 43. When the ratio between the third and fourth distances D3 and D4 satisfies the above condition, it is possible to spread the current to the edges of the semiconductor layer 2. The region of the semiconductor layer 2 extending over the above distance D3 has the external connection 43a on only the right side (in the plan view of FIG. 7) of the region, while the region of the semiconductor layer 2 extending over the above distance D4 has the external connection 43a on each of the right and left sides (in the plan view of FIG. 7) of the region. Therefore, the distance D4 can be greater than the distance D3 as above without causing a problem in spreading the current.

In addition, in consideration of the spread of the current and the mountability of the semiconductor light emitting element 50, it is preferable to adjust the lengths of the first elongated portion 43b and the second elongated portion 43c according to the size of the semiconductor light emitting element 50. For example, in the case where the semiconductor light emitting element 50 is 2 square millimeters in size, the ratio of the first length L1, the second length L2, and the third length L3 is preferably 2:1:1 to 5:2:3, and more preferably 2:1:1. The first length L1 is the length, in the direction in which the upper and lower side faces (in FIG. 7) are opposed, of the near-tip part of each first elongated portion 43b in the first half of the first electrodes 43 (formed in large part on the aforementioned first region of the upper surface of the semiconductor layer 2) which overlaps the near-tip parts of the first elongated portions 43b in the second half of the first electrodes 43 (formed in large part on the aforementioned second region of the upper surface of the semiconductor layer 2) in the direction in which the first electrodes 43 are arrayed (in the horizontal direction in FIG. 7), or the length, in the direction in which the upper and lower side faces (in FIG. 7) are opposed, of the near-tip part of each first elongated portion 43b in the second half of the first electrodes 43 which overlaps the near-tip parts of the first elongated portions 43b in the first half of the first electrodes 43 in the direction in which the first electrodes 43 are arrayed (in the horizontal direction in FIG. 7). The second length L2 is the length, in the direction in which the upper and lower side faces (in FIG. 7) are opposed, of the part of each first elongated portion 43b in the first half of the first electrodes 43 which does not overlap the first elongated portions 43b in the second half of the first electrodes 43 in the direction in which the first electrodes 43 are arrayed (in the horizontal direction in FIG. 7), or the length, in the direction in which the upper and lower side faces (in FIG. 7) are opposed, of the part of each first elongated portion 43b in the second half of the first electrodes 43 which does not overlap the first elongated portions 43b of the first half of the first electrodes 43 in the direction in which the first electrodes 43 are arrayed (in the horizontal direction in FIG. 7). The third length L3 is the length of each second elongated portion 43c formed on the first or second region of the semiconductor layer 2.

Figure 27:
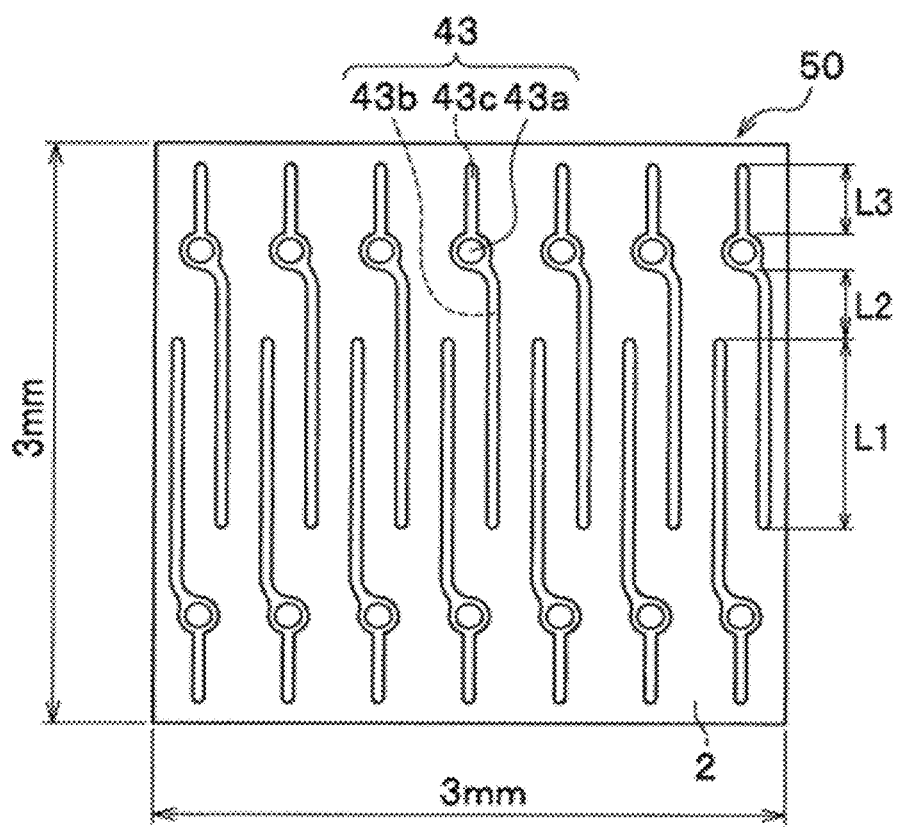
FIG. 27 is a plan view of the semiconductor light emitting element according to the fifth embodiment in the case where the semiconductor light emitting element 50 is 3 square millimeters in size.

Further, in the case where the semiconductor light emitting element 50 is 3 square millimeters in size as illustrated in FIG. 27, the ratio of the first length L1, the second length L2, and the third length L3 is preferably 2:1:1 to 5:2:3, and more preferably 5:2:3. In the case where the lengths of the first elongated portion 43b and the second elongated portion 43c are adjusted as above, it is possible to make the current uniformly spread over the semiconductor layer 2 including the near-edge regions and the central region. In addition, since the wire loops connecting the external connections 43a and the external power supply can be reduced, light absorption by the wiring and hindrance to the light output can be suppressed.

Furthermore, as in the first embodiment, the sum of the lengths of the first elongated portion 43b and the second elongated portion 43c in each of the first electrodes 43 (i.e., the sum of the first, second, and third lengths L1, L2, and L3) is preferably 900 to 1500 micrometers.

6. Sixth Embodiment

Figure 8:
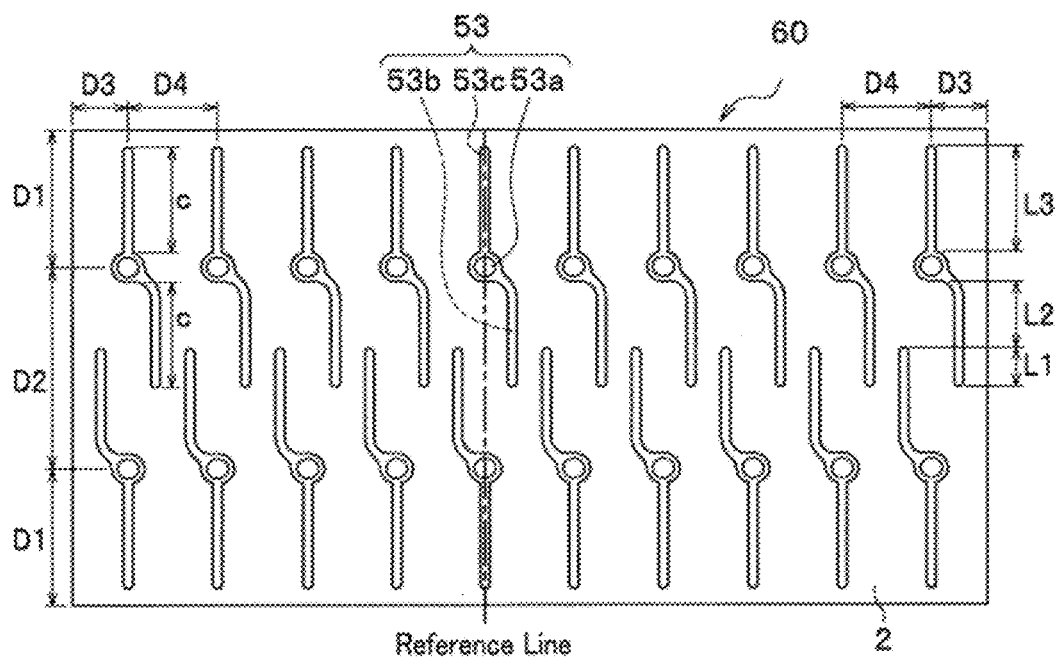
FIG. 8 is a plan view of a semiconductor light emitting element according to a sixth embodiment of the present invention.

The semiconductor light emitting element 60 according to the sixth embodiment is explained below with reference to FIG. 8. The semiconductor light emitting element 60 according to the sixth embodiment has a structure similar to the semiconductor light emitting element 30 according to the third embodiment except for the arrangement of the first electrodes, which is illustrated in FIG. 8. Therefore, in the following explanations on the sixth embodiment, structures identical or equivalent to the semiconductor light emitting element 30 according to the third embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 60 according to the sixth embodiment are similar to the first embodiment, the descriptions of the cross-sectional structure and the production process are not repeated.

The semiconductor light emitting element 60 has first electrodes 53 instead of the first electrodes 23, and each of the first electrodes 53 in the semiconductor light emitting element 60 has an external connection 53a, a first elongated portion 53b, and a second elongated portion 53c which are respectively similar to the external connection 23a, the first elongated portion 23b, and the second elongated portion 23c in the first electrodes 23 in the third embodiment. However, as illustrated in FIG. 8, in the semiconductor light emitting element 60 according to the sixth embodiment, the first elongated portion 53b and the second elongated portion 53c have an identical dimension c in the direction in which the two side faces of the semiconductor layer are opposed (i.e., the vertical direction in FIG. 8). Therefore, in the semiconductor light emitting element 60 according to the sixth embodiment, the positions of the external connections 53a are further shifted toward the central region from the positions of the external connections 43a in the fifth embodiment.

Since the dimension of the first elongated portion 53b and the dimension of the first elongated portion 53c in the direction in which the two side faces of the semiconductor layer are opposed (i.e., the vertical direction in FIG. 8) are equalized, the positions of the external connections 53a are further brought nearer to the central region of the semiconductor layer 2. In addition, the current tends to concentrate around the external connections 53a. Therefore, it is possible to greatly compensate for the insufficiency of current in the central region of the semiconductor layer 2, and reduce the variations in the current density between the sides and the central region of the semiconductor layer 2.

In the case where the external connections 53a are arranged at positions relatively near to the central region of the semiconductor layer 2 as in the semiconductor light emitting element 60 according to the sixth embodiment, the ratio of the aforementioned first distance D1 to the aforementioned second distance D2 is preferably 1:1 to 1:2.5, and more preferably 1:1. When the ratio between the distances D1 and D2 satisfies the above condition, it is possible to achieve uniform current density in the semiconductor light emitting element 60. In addition, as in the semiconductor light emitting element 50 according to the fifth embodiment, the ratio of the third distance D3 to the fourth distance D4 in the semiconductor light emitting element 60 is preferably 1:1.5. Further, as in the semiconductor light emitting element 50, it is preferable that the ratio of the first length L1, the second length L2, and the third length L3 in the semiconductor light emitting element 60 be 2:1:1 to 5:2:3.

7. Seventh Embodiment

Figure 9:
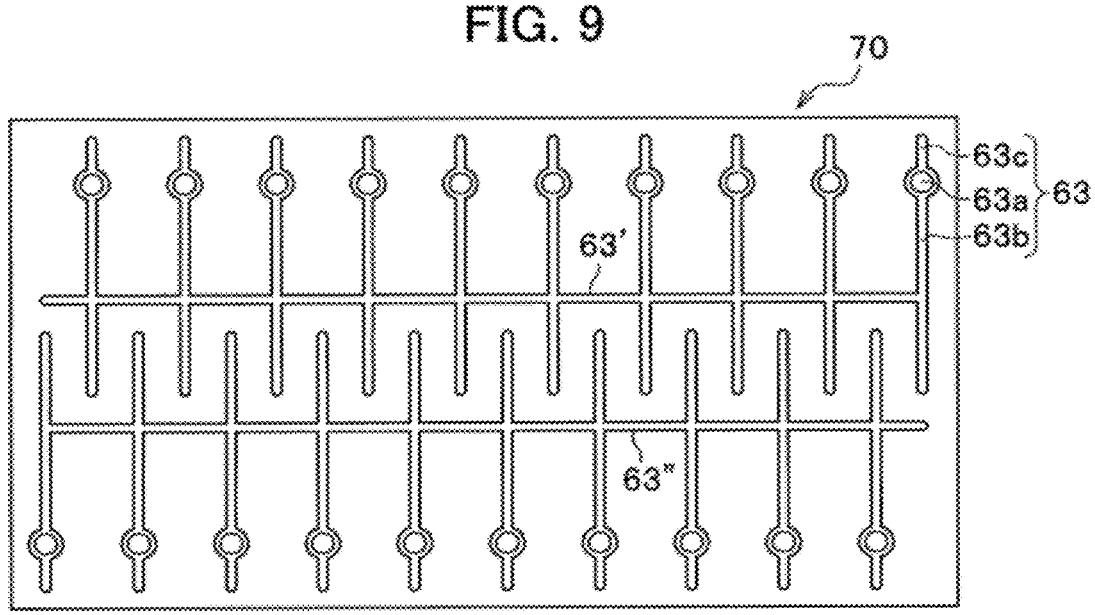
FIG. 9 is a plan view of a semiconductor light emitting element according to a seventh embodiment of the present invention.

The semiconductor light emitting element 70 according to the seventh embodiment is explained below with reference to FIG. 9. The semiconductor light emitting element 70 according to the seventh embodiment has a structure similar to the semiconductor light emitting element 10 according to the first embodiment except for the arrangement of the first electrodes and connection of the first electrodes, which are illustrated in FIG. 9. Therefore, in the following explanations on the seventh embodiment, structures identical or equivalent to the semiconductor light emitting element 10 according to the first embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 70 according to the seventh embodiment are similar to the first embodiment, the descriptions of the cross-sectional structure and the production process are not repeated.

The semiconductor light emitting element 70 has first electrodes 63 instead of the first electrodes 3, and each of the first electrodes 63 in the semiconductor light emitting element 70 has an external connection 63a, a first elongated portion 63b, and a second elongated portion 63c which are respectively similar to the external connection 3a, the first elongated portion 3b, and the second elongated portion 3c in the first electrodes 3 in the first embodiment. However, as illustrated in FIG. 9, in the semiconductor light emitting element 70, the first elongated portions 63b of the first half of the set of first electrodes 63 (which are in large part in the aforementioned first region of the upper surface of the semiconductor layer 2) are connected through a first traverse electrode 63'. In addition, the first elongated portions 63b of the second half of the set of first electrodes 63 (which are in large part in the aforementioned second region of the upper surface of the semiconductor layer 2) are connected through a second traverse electrode 63''. The first traverse electrode 63' connects the elongated portions 63b of the first half of the set of first electrodes 63 at the positions at which the elongated portions 63b of the first half of the set of first electrodes 63 do not overlap the first elongated portions 63b of the second half of the set of first electrodes 63 in the direction in which the first electrodes 63 are arrayed (in the horizontal direction in FIG. 9), and the second traverse electrode 63'' connects the elongated portions 63b of the second half of the set of first electrodes 63 at the positions at which the elongated portions 63b of the second half of the set of first electrodes 63 do not overlap the first elongated portions 63b of the first half of the set of first electrodes 63 in the direction in which the first electrodes 63 are arrayed (in the horizontal direction in FIG. 9). The first traverse electrode 63' and the second traverse electrode 63'' can be formed in the same manner as the first electrodes 63 at the same time as the first electrodes 63.

As explained above, the first elongated portions 63b of the first half of the set of first electrodes 63 are connected through the first traverse electrode 63' at the positions at which the elongated portions 63b of the first half of the set of first electrodes 63 do not overlap the first elongated portions 63b of the second half of the set of first electrodes 63 in the direction in which the first electrodes 63 are arrayed, and the first elongated portions 63b of the second half of the set of first electrodes 63 are connected through the second traverse electrode 63'' at the positions at which the elongated portions 63b of the second half of the set of first electrodes 63 do not overlap the first elongated portions 63b of the first half of the set of first electrodes 63 in the direction in which the first electrodes 63 are arrayed. Therefore, it is possible to further compensate for the insufficiency of current in the central region of the semiconductor layer 2, and reduce the variations in the current density between the central region and the near-edge regions of the semiconductor layer.

8. Eighth Embodiment

Figure 10:
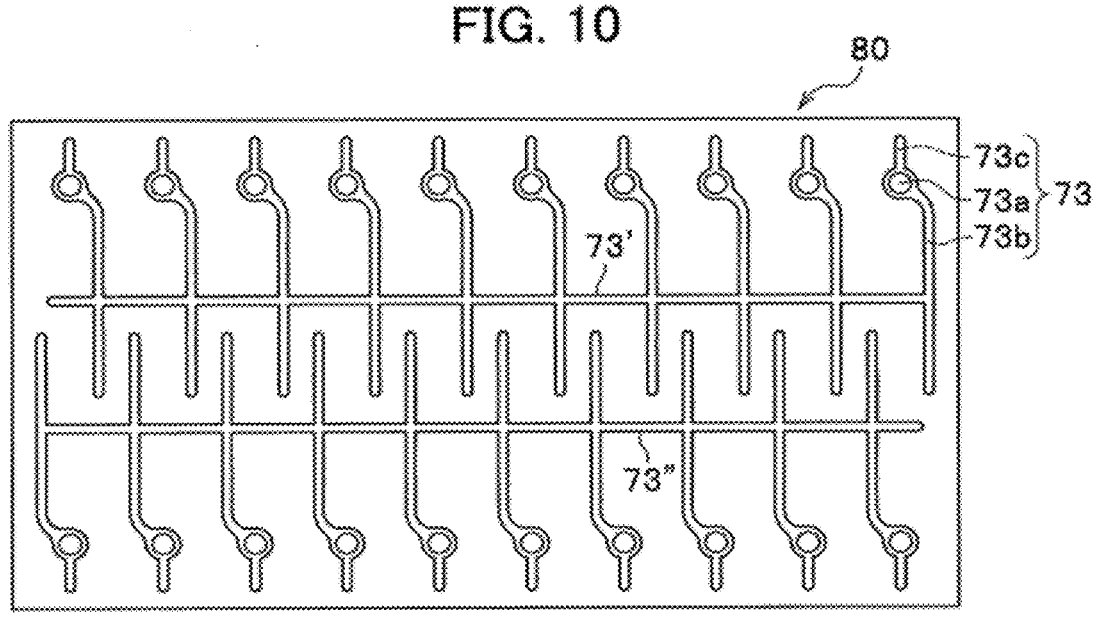
FIG. 10 is a plan view of a semiconductor light emitting element according to an eighth embodiment of the present invention.

The semiconductor light emitting element 80 according to the eighth embodiment is explained below with reference to FIG. 10. The semiconductor light emitting element 80 according to the eighth embodiment has a structure similar to the semiconductor light emitting element 30 according to the third embodiment except for the arrangement of the first electrodes and connection of the first electrodes, which are illustrated in FIG. 10. Therefore, in the following explanations on the eighth embodiment, structures identical or equivalent to the semiconductor light emitting element 30 according to the third embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 80 according to the eighth embodiment are similar to the first embodiment, the descriptions of the cross-sectional structure and the production process are not repeated.

The semiconductor light emitting element 80 has first electrodes 73 instead of the first electrodes 23, and each of the first electrodes 73 in the semiconductor light emitting element 80 has an external connection 73a, a first elongated portion 73b, and a second elongated portion 73c which are respectively similar to the external connection 23a, the first elongated portion 23b, and the second elongated portion 23c in the first electrodes 23 in the third embodiment. However, as illustrated in FIG. 10, in the semiconductor light emitting element 80, the first elongated portions 73b of the first half of the set of first electrodes 73 (which are in large part in the aforementioned first region of the upper surface of the semiconductor layer 2) are connected through a first traverse electrode 73'. In addition, the first elongated portions 73b of the second half of the set of first electrodes 73 (which are in large part in the aforementioned second region of the upper surface of the semiconductor layer 2) are connected through a second traverse electrode 73''. The first traverse electrode 73' connects the elongated portions 73b of the first half of the set of first electrodes 73 at the positions at which the elongated portions 73b of the first half of the set of first electrodes 73 do not overlap the first elongated portions 73b of the second half of the set of first electrodes 73 in the direction in which the first electrodes 73 are arrayed (in the horizontal direction in FIG. 9), and the second traverse electrode 73'' connects the elongated portions 73b of the second half of the set of first electrodes 73 at the positions at which the elongated portions 73b of the second half of the set of first electrodes 73 do not overlap the first elongated portions 73b of the first half of the set of first electrodes 73 in the direction in which the first electrodes 73 are arrayed (in the horizontal direction in FIG. 9). The first traverse electrode 73' and the second traverse electrode 73'' can be formed in the same manner as the first electrodes 73 at the same time as the first electrodes 73.

As explained above, the first elongated portions 73b of the first half of the set of first electrodes 73 are connected through the first traverse electrode 73' at the positions at which the elongated portions 73b of the first half of the set of first electrodes 73 do not overlap the first elongated portions 73b of the second half of the set of first electrodes 73 in the direction in which the first electrodes 73 are arrayed, and the first elongated portions 73b of the second half of the set of first electrodes 73 are connected through the second traverse electrode 73'' at the positions at which the elongated portions 73b of the second half of the set of first electrodes 73 do not overlap the first elongated portions 73b of the first half of the set of first electrodes 73 in the direction in which the first electrodes 73 are arrayed. Therefore, it is possible to further compensate for the insufficiency of current in the central region of the semiconductor layer 2, and reduce the variations in the current density between the central region and the near-edge regions of the semiconductor layer.

9. Ninth Embodiment

Figure 11:
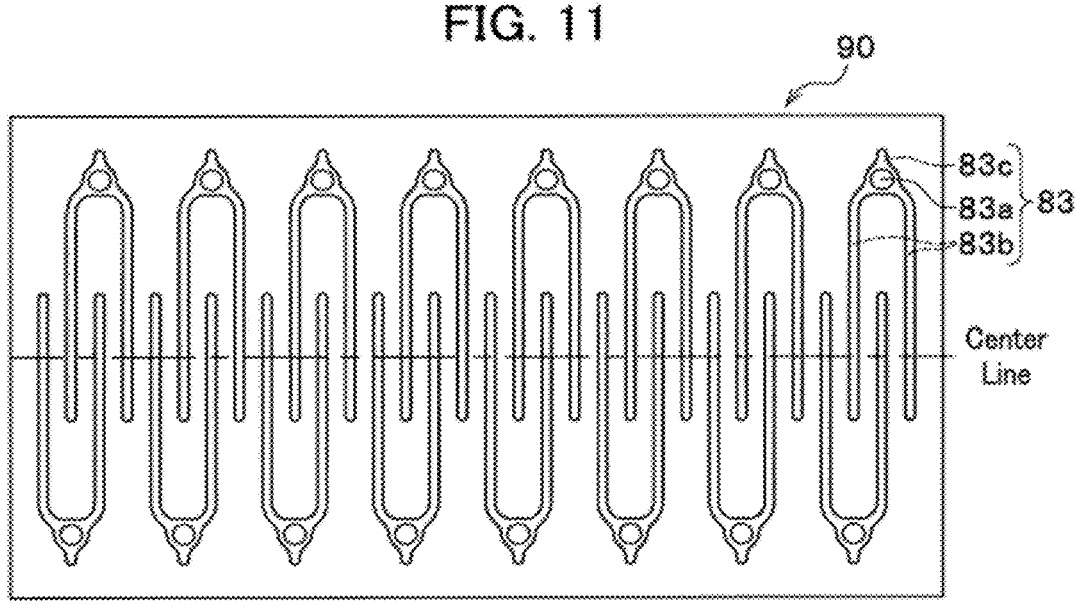
FIG. 11 is a plan view of a semiconductor light emitting element according to a ninth embodiment of the present invention.

The semiconductor light emitting element 90 according to the ninth embodiment is explained below with reference to FIG. 11. The semiconductor light emitting element 90 according to the ninth embodiment has a structure similar to the semiconductor light emitting element 10 according to the first embodiment except for the arrangement of the first electrodes, which is illustrated in FIG. 11. Therefore, in the following explanations on the ninth embodiment, structures identical or equivalent to the semiconductor light emitting element 10 according to the first embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 90 according to the ninth embodiment are similar to the first embodiment, the descriptions of the cross-sectional structure and the production process are not repeated.

The semiconductor light emitting element 90 has first electrodes 83 instead of the first electrodes 3, and each of the first electrodes 83 in the semiconductor light emitting element 90 has an external connection 83a, a first elongated portion 83b, and a second elongated portion 83c which are respectively similar to the external connection 3a, the first elongated portion 3b, and the second elongated portion 3c in the first electrodes 3 in the first embodiment. However, As illustrated in FIG. 11, in the semiconductor light emitting element 90, the first elongated portion 83b of each of the first electrodes 83 branches at the external connection into two subportions each of which extends toward the central region of the upper surface of the semiconductor layer 2.

In the semiconductor light emitting element 90 having the above structure, the branching of each first elongated portion 83b into two subportions increases the area of the electrodes, and spreads the current to a wider area. Therefore, it is possible to further compensate for the insufficiency of current in the central region of the semiconductor layer 2.

10. Tenth Embodiment

Figure 12:
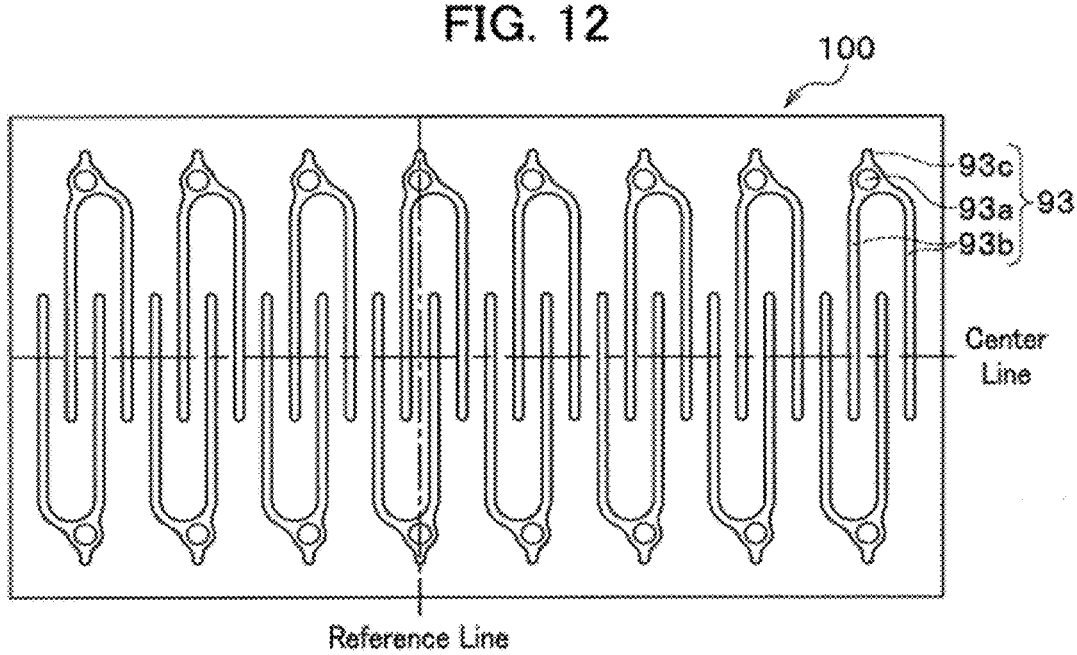
FIG. 12 is a plan view of a semiconductor light emitting element according to a tenth embodiment of the present invention.

The semiconductor light emitting element 100 according to the tenth embodiment is explained below with reference to FIG. 12. The semiconductor light emitting element 100 according to the tenth embodiment has a structure similar to the semiconductor light emitting element 90 according to the ninth embodiment except for the arrangement of the first electrodes, which is illustrated in FIG. 12. Therefore, in the following explanations on the tenth embodiment, structures identical or equivalent to the semiconductor light emitting element 90 according to the ninth embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 100 according to the tenth embodiment are similar to the first embodiment, the descriptions of the cross-sectional structure and the production process are not repeated.

The semiconductor light emitting element 100 has first electrodes 93 instead of the first electrodes 83, and each of the first electrodes 93 in the semiconductor light emitting element 100 has an external connection 93a, a first elongated portion 93b, and a second elongated portion 93c which are respectively similar to the external connection 93a, the first elongated portion 93b, and the second elongated portion 93c in the first electrodes 93 in the ninth embodiment. However, as illustrated in FIG. 12, in the semiconductor light emitting element 100, each of the external connections 93a located on the aforementioned first region of the upper surface of the semiconductor layer 2 and one of the external connections 93a located on the aforementioned second region of the upper surface of the semiconductor layer 2 and opposed to the external connection 93a on the aforementioned first region are on a straight line (as a reference line) in a first direction in which the two side faces of the semiconductor layer 2 are opposed to each other (i.e., in the vertical direction in FIG. 12). In other words, the external connections 93a located on the first region of the upper surface of the semiconductor layer 2 and the external connections 93a located on the second region of the upper surface of the semiconductor layer 2 are symmetrically arranged with respect to the center line of the upper surface of the semiconductor layer 2. Thus, although current is likely to concentrate around the external connections 93a, the external connections 93a of the first electrodes 93 are arranged in balance (at regular intervals) on the semiconductor layer 2.

In the semiconductor light emitting element 100 having the above structure, the external connections 93a opposed to each other on the semiconductor layer 2 in the first direction in which the two side faces of the semiconductor layer 2 are opposed to each other are arranged on a straight line. Therefore, it is possible to regularize the distances from the side faces of the semiconductor layer to the external connections, and thus relieve the concentration of current or the insufficiency of current in the gap between the external connections and the side faces of the semiconductor layer.

11. Eleventh Embodiment

Figure 13:
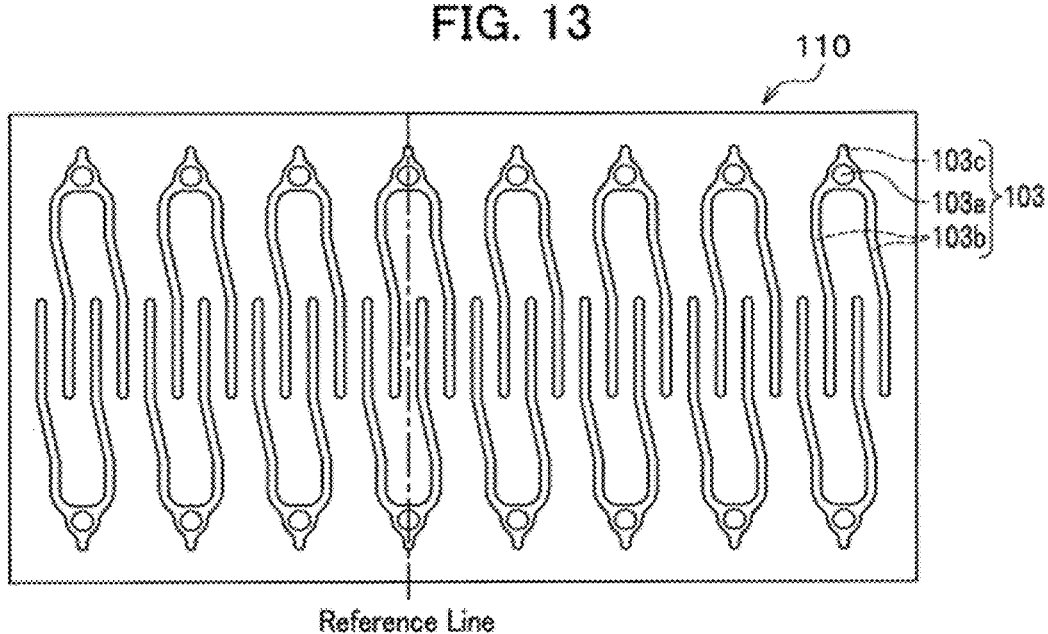
FIG. 13 is a plan view of a semiconductor light emitting element according to an eleventh embodiment of the present invention.

The semiconductor light emitting element 110 according to the eleventh embodiment is explained below with reference to FIG. 13. The semiconductor light emitting element 110 according to the eleventh embodiment has a structure similar to the semiconductor light emitting element 100 according to the tenth embodiment except for the arrangement of the first electrodes, which is illustrated in FIG. 13. Therefore, in the following explanations on the eleventh embodiment, structures identical or equivalent to the semiconductor light emitting element 100 according to the tenth embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 110 according to the eleventh embodiment are similar to the first embodiment, the descriptions of the cross-sectional structure and the production process are not repeated.

The semiconductor light emitting element 110 has first electrodes 103 instead of the first electrodes 93, and each of the first electrodes 103 in the semiconductor light emitting element 110 has an external connection 103a, a first elongated portion 103b, and a second elongated portion 103c which are respectively similar to the external connection 93a, the first elongated portion 93b, and the second elongated portion 93c in the first electrodes 93 in the tenth embodiment. However, as illustrated in FIG. 13, in the semiconductor light emitting element 110, a middle part of the first elongated portion 103b of each of the first electrodes 103 is oblique to the aforementioned reference line. In addition, the part of the first elongated portion 103b of each of the first electrodes 103 located on the central region of the upper surface of the semiconductor layer 2 extends parallel to the reference line.

In the semiconductor light emitting element 110 having the above structure, the first elongated portions 103b curve along predetermined directions. Therefore, the area of the electrodes increases, and the current can be spread over a wider area.

12. Twelfth Embodiment

Figure 14:
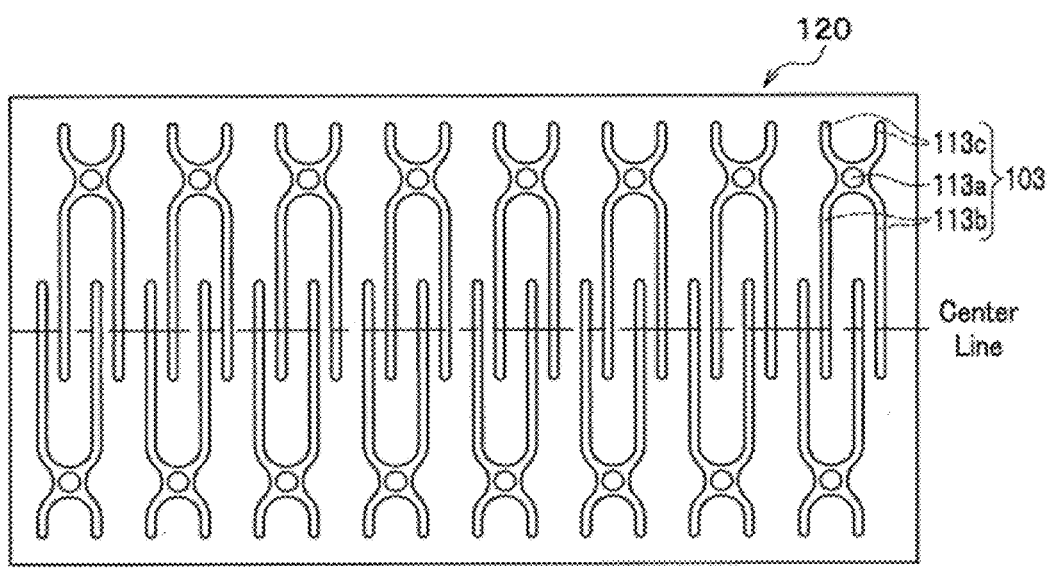
FIG. 14 is a plan view of a semiconductor light emitting element according to a twelfth embodiment of the present invention.

The semiconductor light emitting element 120 according to the twelfth embodiment is explained below with reference to FIG. 14. The semiconductor light emitting element 120 according to the twelfth embodiment has a structure similar to the semiconductor light emitting element 90 according to the ninth embodiment except for the arrangement of the first electrodes, which is illustrated in FIG. 14. Therefore, in the following explanations on the twelfth embodiment, structures identical or equivalent to the semiconductor light emitting element 90 according to the ninth embodiment are referred to by the same denotations and the same or similar reference numbers, and the descriptions of the identical or equivalent elements or constituents are not repeated unless necessary. In addition, since the cross-sectional structure of and the production process for the semiconductor light emitting element 120 according to the twelfth embodiment are similar to the first embodiment, the descriptions of the cross-sectional structure and the production process are not repeated.

The semiconductor light emitting element 120 has first electrodes 113 instead of the first electrodes 83, and each of the first electrodes 113 in the semiconductor light emitting element 120 has an external connection 113a, a first elongated portion 113b, and a second elongated portion 113c which are respectively similar to the external connection 83a, the first elongated portion 83b, and the second elongated portion 83c in the first electrodes 83 in the ninth embodiment. However, as illustrated in FIG. 14, in the semiconductor light emitting element 120, the second elongated portion 113c of each of the first electrodes 113 branches at the external connection 113a into two subportions each of which extends toward a nearer one of the opposed side faces of the semiconductor layer 2 (in the vertical direction in FIG. 14).

In the semiconductor light emitting element 120 having the above structure, the branching of each second elongated portion 113c into two subportions, as well as the branching of each first elongated portion 113b into two subportions, increases the area of the electrodes, and spreads the current to a wider area. Therefore, it is possible to reduce the variations in the current density between the central region and the near-edge regions of the semiconductor layer.

13. Experimental Examples

Hereinbelow, examples of experiments performed for confirming the effects of the semiconductor light emitting elements according to the present invention are explained with reference to FIGS. 15A to 24B. The following experimental examples of the semiconductor light emitting elements respectively have different electrode arrangements. In the experiments, current has been supplied to the experimental examples, and the distribution of the current density in each semiconductor light emitting element has been observed. Then, the variations in the current density in the semiconductor light emitting elements have been compared on the basis of the distribution of the current density.

The distribution of the current density in each semiconductor light emitting element has been observed and analyzed by use of simulation software performing the finite element method. FIGS. 15A to 23A illustrate the arrangements of the first electrodes in the semiconductor light emitting elements used in the experiments, and FIGS. 15B to 23B show the observed images indicating the distribution of the current density in the respective semiconductor light emitting elements. The bars respectively presented below the observed images in FIGS. 15B to 23B indicate the correspondence between the current density and the illustrated gradation in the observed images, where the current density corresponding to the gradation increases from the left to the right direction in the bars.

13.1 Comparison Example 1

Figure 15A:
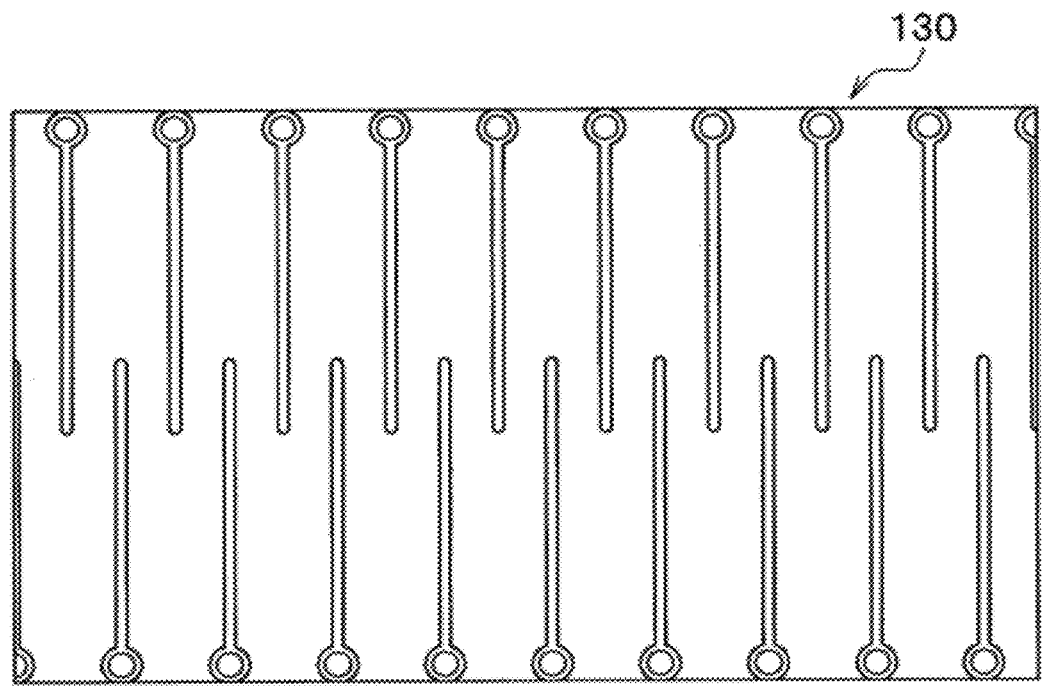
FIG. 15A is a plan view of a semiconductor light emitting element as a comparison example 1.
Figure 15B:
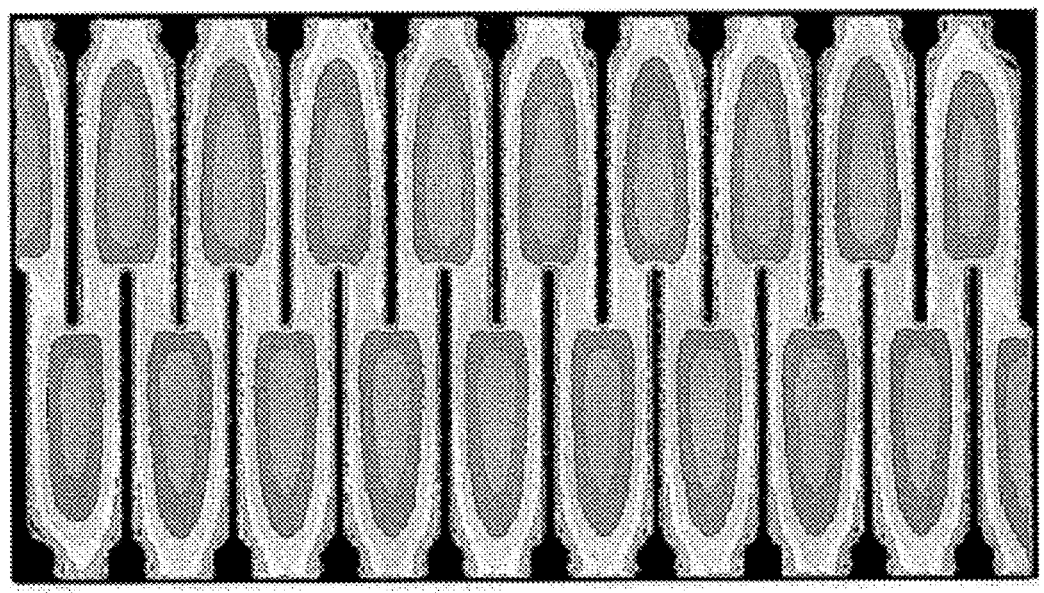
FIG. 15B is a diagram indicating the distribution of the current density in the semiconductor light emitting element of the comparison example 1.

FIG. 15A is a plan view illustrating the arrangement of the first electrodes in the semiconductor light emitting element 130 as a comparison example 1. As illustrated in FIG. 15A, the first electrodes in the comparison example 1 do not have the aforementioned second elongated portions which are provided according to the present invention, and external connections are formed in contact with the side faces of the semiconductor layer. As mentioned before, current is likely to concentrate in the regions near the side faces of the semiconductor layer, and is inherently likely to concentrate around the external connections. Therefore, the formation of the external connections in contact with the side faces of the semiconductor layer lowers the current density in the central region of the semiconductor layer, and increases the current density in the regions near the side faces, as shown in FIG. 15B. That is, FIG. 15B shows that the variations in the current density between the central region and the regions near the side faces of the semiconductor layer increase in the semiconductor light emitting element 130 having the shapes and arrangement of electrodes as illustrated in FIG. 15A. In other words, the semiconductor light emitting element 130 cannot achieve uniform distribution of light emission.

13.2 Comparison Example 2

Figure 16A:
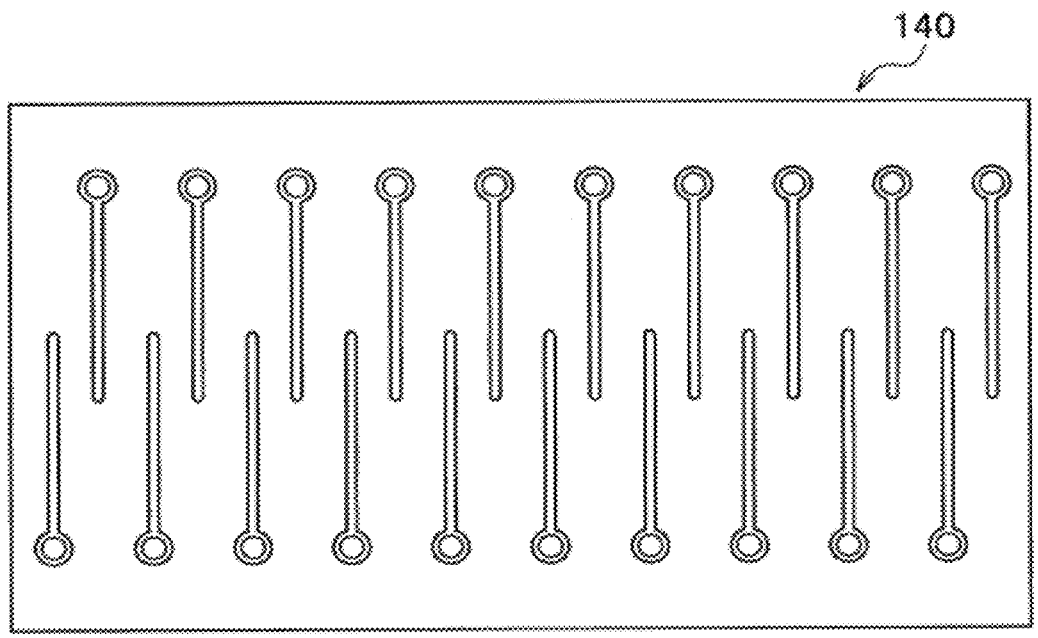
FIG. 16A is a plan view of a semiconductor light emitting element as a comparison example 2.
Figure 16B:
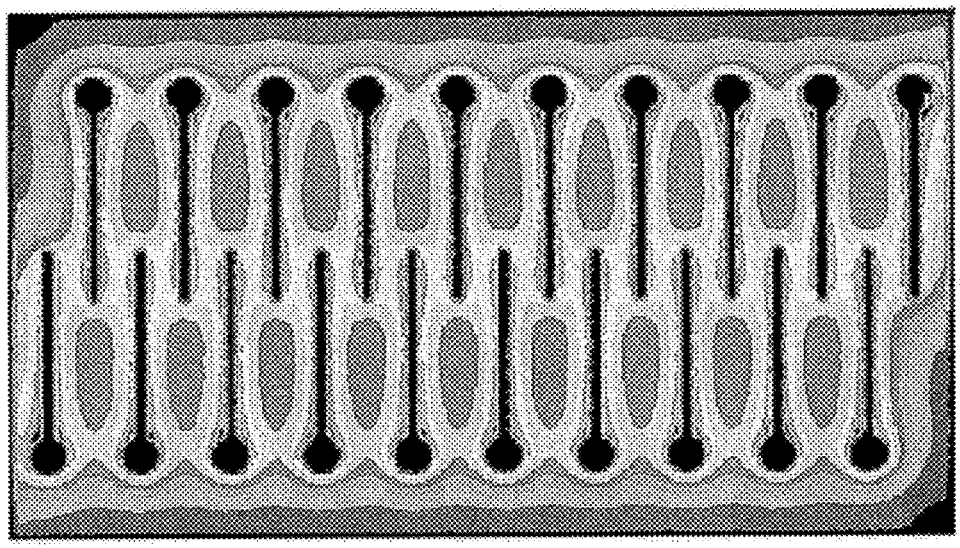
FIG. 16B is a diagram indicating the distribution of the current density in the semiconductor light emitting element of the comparison example 2.

FIG. 16A is a plan view illustrating the arrangement of the first electrodes in the semiconductor light emitting element 140 as a comparison example 2. As illustrated in FIG. 16A, the first electrodes in the comparison example 2 do not have the aforementioned second elongated portions which are provided according to the present invention. Therefore, it is impossible to spread the current to the regions near the side faces of the semiconductor layer, so that the current density in the regions near the side faces is lowered as shown in FIG. 16B. That is, FIG. 16B shows that the variations in the current density between the central region and the regions near the side faces of the semiconductor layer increase in the semiconductor light emitting element 140 having the shapes and arrangement of electrodes as illustrated in FIG. 16A. In other words, the semiconductor light emitting element 140 cannot achieve uniform distribution of light emission.

13.3 Comparison Example 3

Figure 17A:
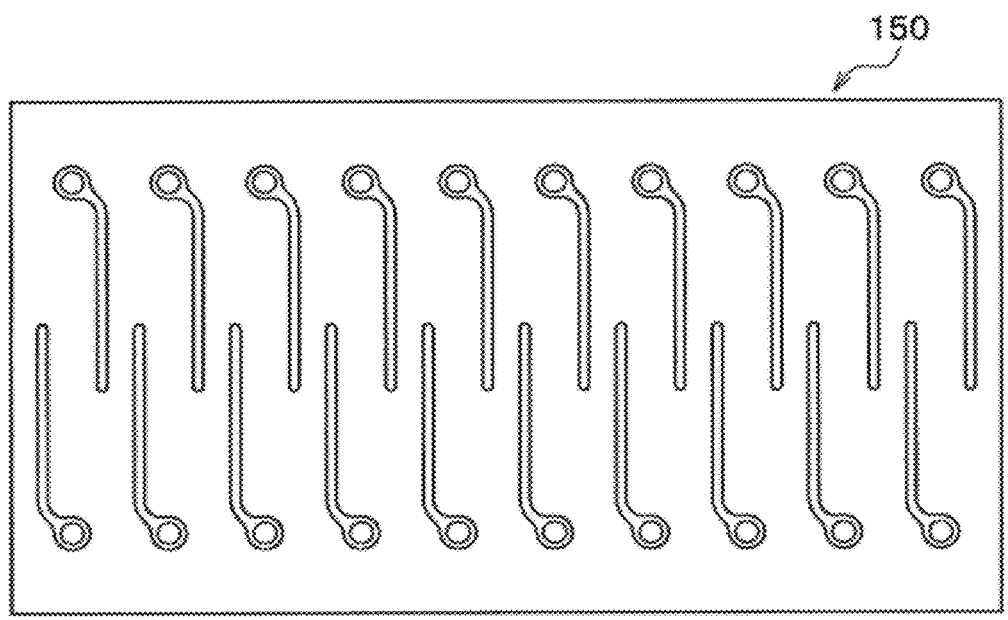
FIG. 17A is a plan view of a semiconductor light emitting element as a comparison example 3.
Figure 17B:
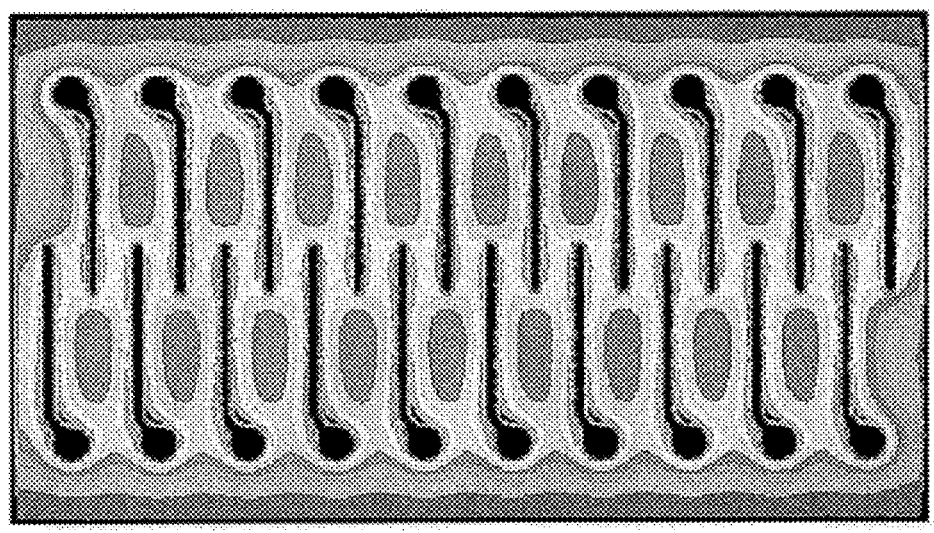
FIG. 17B is a diagram indicating the distribution of the current density in the semiconductor light emitting element of the comparison example 3.

FIG. 17A is a plan view illustrating the arrangement of the first electrodes in the semiconductor light emitting element 150 as a comparison example 3. As illustrated in FIG. 17A, the first electrodes in the comparison example 3 do not have the aforementioned second elongated portions which are provided according to the present invention. Therefore, it is impossible to spread the current to the regions near the side faces of the semiconductor layer, so that the current density in the regions near the side faces is lowered as shown in FIG. 17B. That is, FIG. 17B shows that the variations in the current density between the central region and the regions near the side faces of the semiconductor layer increase in the semiconductor light emitting element 150 having the shapes and arrangement of electrodes as illustrated in FIG. 17A. In other words, the semiconductor light emitting element 150 cannot achieve uniform distribution of light emission.

13.4 Concrete Example 1

Figure 18A:
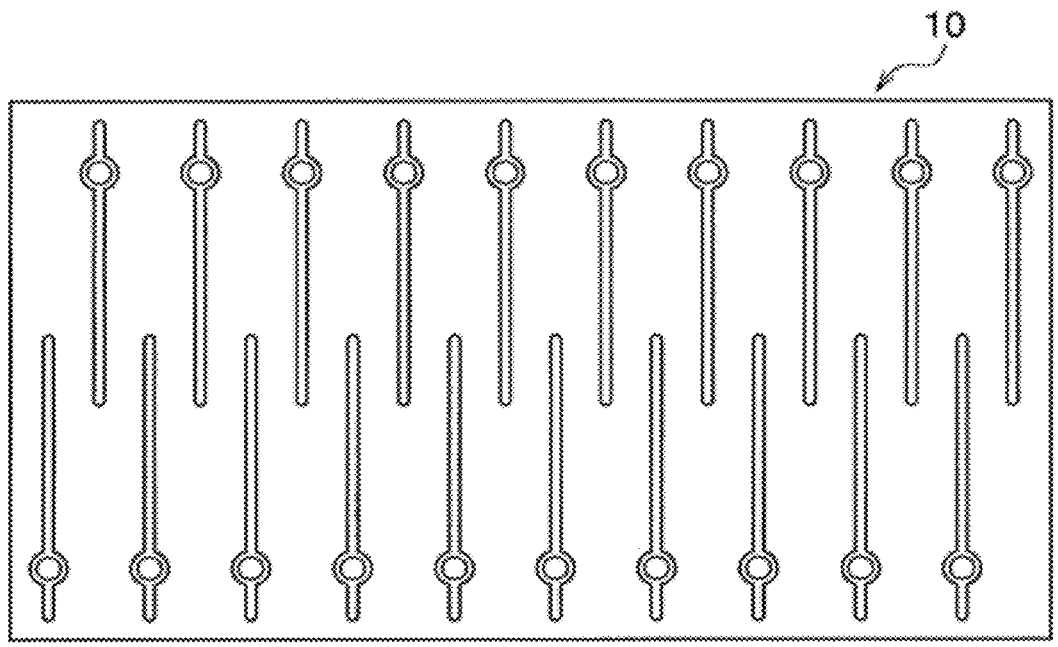
FIG. 18A is a plan view of a semiconductor light emitting element as a concrete example 1 of the present invention.

FIG. 18A is a plan view illustrating the arrangement of the first electrodes in the semiconductor light emitting element 10 as a concrete example 1 of the present invention. The semiconductor light emitting element 10 of the concrete example 1 corresponds to the semiconductor light emitting element 10 according to the first embodiment explained before. As illustrated in FIG. 18A, the first electrodes in the concrete example 1 include the first elongated portions and the second elongated portions which are provided according to the present invention.

Figure 18B:
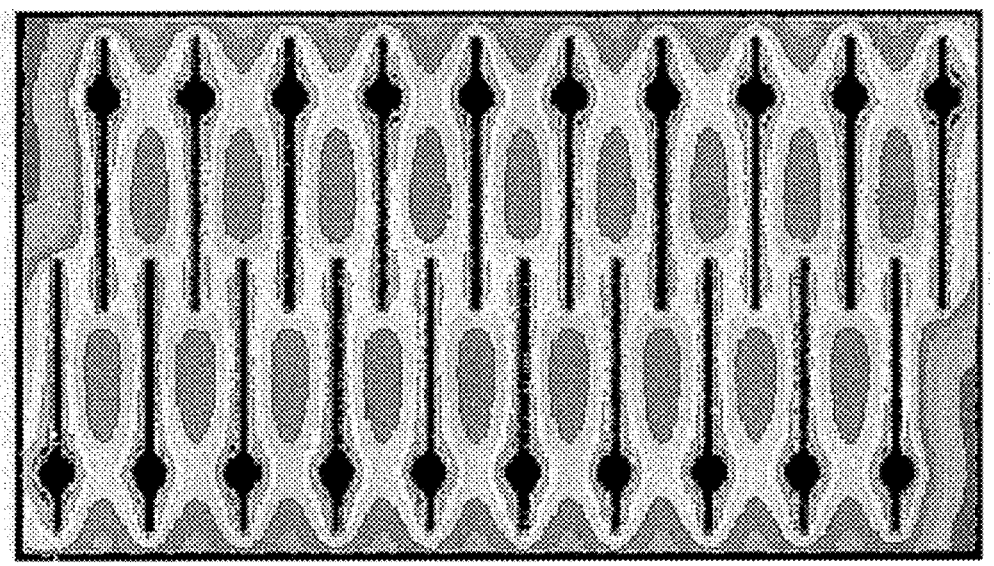
FIG. 18B is a diagram indicating the distribution of the current density in the semiconductor light emitting element of the concrete example 1.

Therefore, it is possible to spread the current to the regions near the side faces, and uniformly increase the current density over the semiconductor layer including the central region and the regions near the side faces as shown in FIG. 18B. That is, FIG. 18B shows that the variations in the current density between the central region and the regions near the side faces of the semiconductor layer can be reduced in the semiconductor light emitting element 10 having the shapes and arrangement of electrodes as illustrated in FIG. 18A, so that uniform distribution of light emission is enabled.

13.5 Concrete Example 2

Figure 19A:
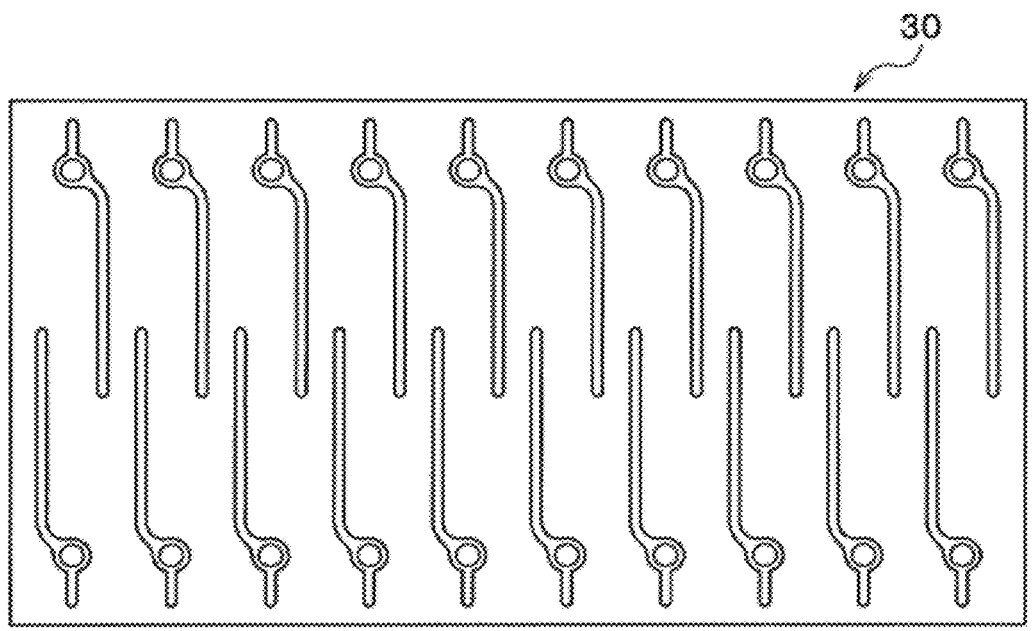
FIG. 19A is a plan view of a semiconductor light emitting element as a concrete example 2 of the present invention.

FIG. 19A is a plan view illustrating the arrangement of the first electrodes in the semiconductor light emitting element 30 as a concrete example 2 of the present invention. The semiconductor light emitting element 30 of the concrete example 2 corresponds to the semiconductor light emitting element 30 according to the third embodiment explained before. As illustrated in FIG. 19A, the first electrodes in the concrete example 2 include the first elongated portions and the second elongated portions which are provided according to the present invention. In addition, the external connections of the first electrodes formed in large part on the aforementioned first region of the upper surface of the semiconductor layer 2 and the first electrodes formed in large part on the aforementioned second region of the upper surface of the semiconductor layer 2 are symmetrically arranged with respect to the center line of the upper surface of the semiconductor layer. Further, a first part of each first elongated portion extends in a direction oblique to the aforementioned reference line (which passes through a pair of external connections opposed to each other with respect to the center line of the upper surface of the semiconductor layer), and a second part of the first elongated portion extends in the direction parallel to the reference line.

Figure 19B:
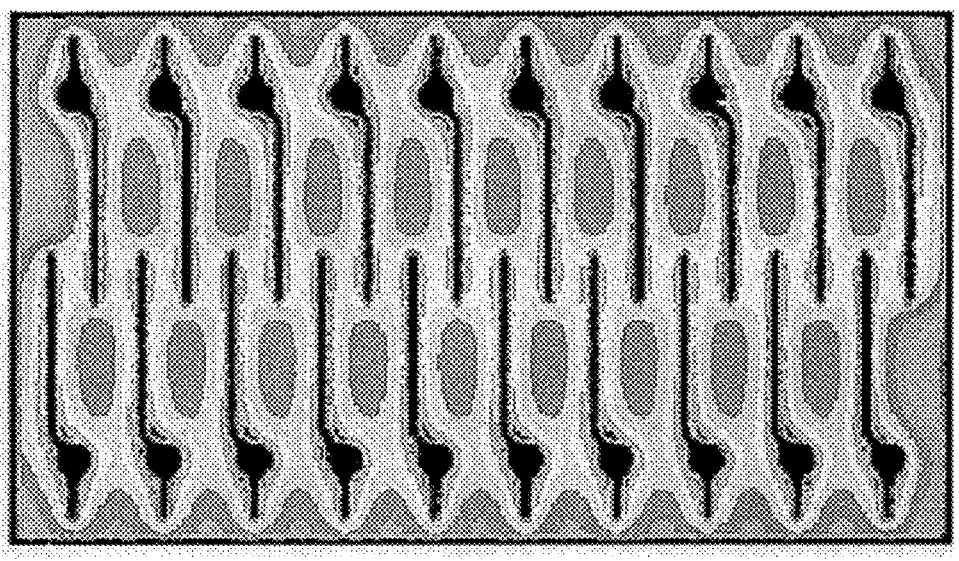
FIG. 19B is a diagram indicating the distribution of the current density in the semiconductor light emitting element of the concrete example 2.

Therefore, as shown in FIG. 19B, the area of electrodes can be increased, and a greater amount of current can be spread to the central region of the upper surface of the semiconductor layer. In addition, the current density can be increased more uniformly over the semiconductor layer including the central region and the regions near the side faces. That is, FIG. 19B shows that the variations in the current density between the central region and the regions near the side faces of the semiconductor layer can be reduced in the semiconductor light emitting element 30 having the shapes and arrangement of electrodes as illustrated in FIG. 19A, so that more uniform distribution of light emission is enabled.

13.6 Concrete Example 3

Figure 20A:
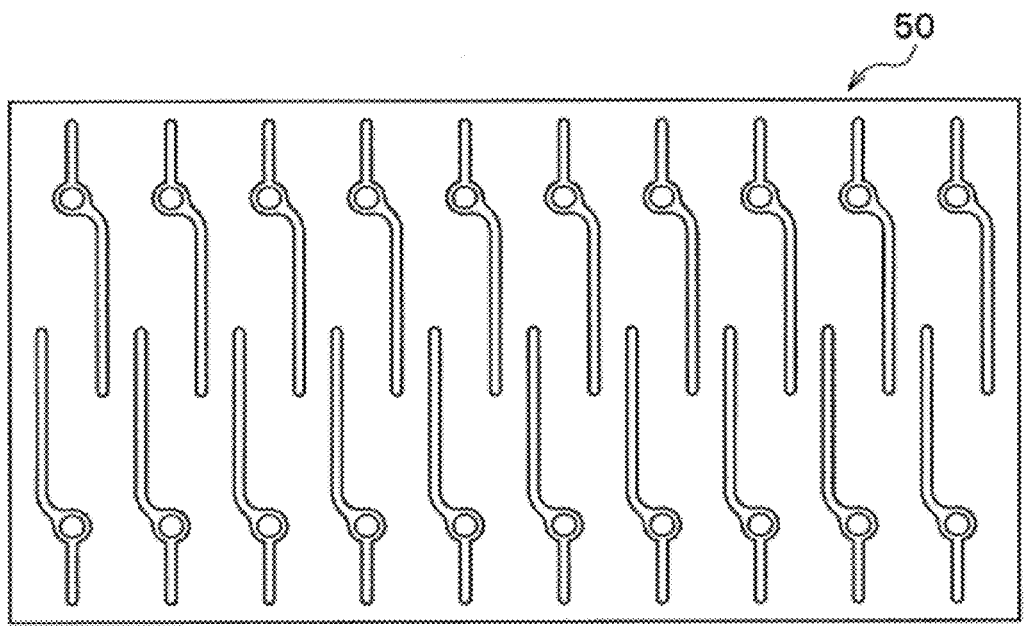
FIG. 20A is a plan view of a semiconductor light emitting element as a concrete example 3 of the present invention.

FIG. 20A is a plan view illustrating the arrangement of the first electrodes in the semiconductor light emitting element 50 as a concrete example 3 of the present invention. The semiconductor light emitting element 50 of the concrete example 3 corresponds to the semiconductor light emitting element 50 according to the fifth embodiment explained before. As illustrated in FIG. 20A, the semiconductor light emitting element 50 of the concrete example 3 has a structure similar to the semiconductor light emitting element 30 of the concrete example 2. However, in the semiconductor light emitting element 50, the positions of the external connections in the semiconductor light emitting element 50 are shifted toward the central region of the semiconductor layer 2 from the positions of the external connections in the semiconductor light emitting element 30.

Figure 20B:
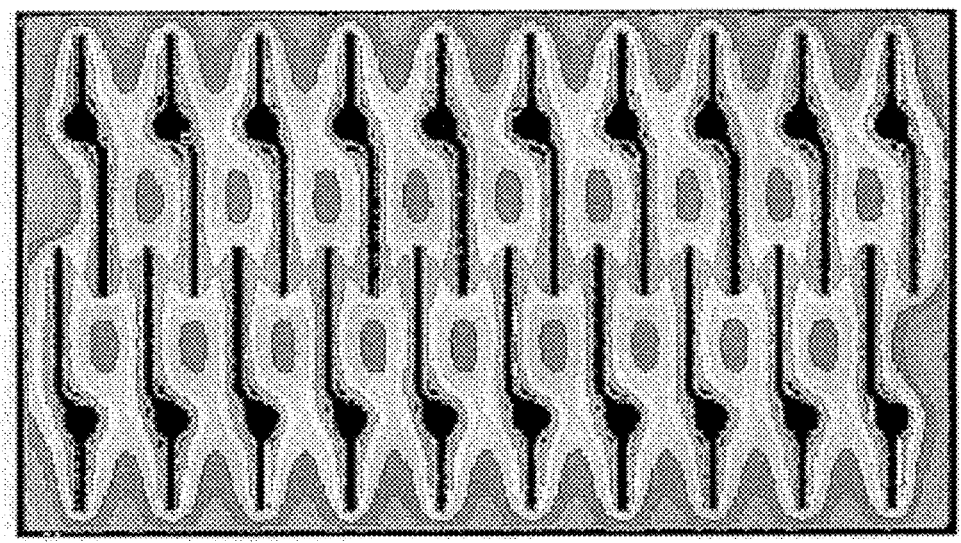
FIG. 20B is a diagram indicating the distribution of the current density in the semiconductor light emitting element of the concrete example 3.

As explained above, the external connections in the semiconductor light emitting element 50, around which the current is likely to concentrate, are brought nearer to the central region of the semiconductor layer 2. Therefore, the current density in the central region of the semiconductor layer 2 can be increased, although the insufficiency of current is likely to occur in the central region of the semiconductor layer 2. Thus, FIG. 20B shows that the variations in the current density between the central region and the regions near the side faces of the semiconductor layer can be reduced in the semiconductor light emitting element 50 having the shapes and arrangement of electrodes as illustrated in FIG. 20A, so that more uniform distribution of light emission is enabled.

13.7 Concrete Example 4

Figure 21A:
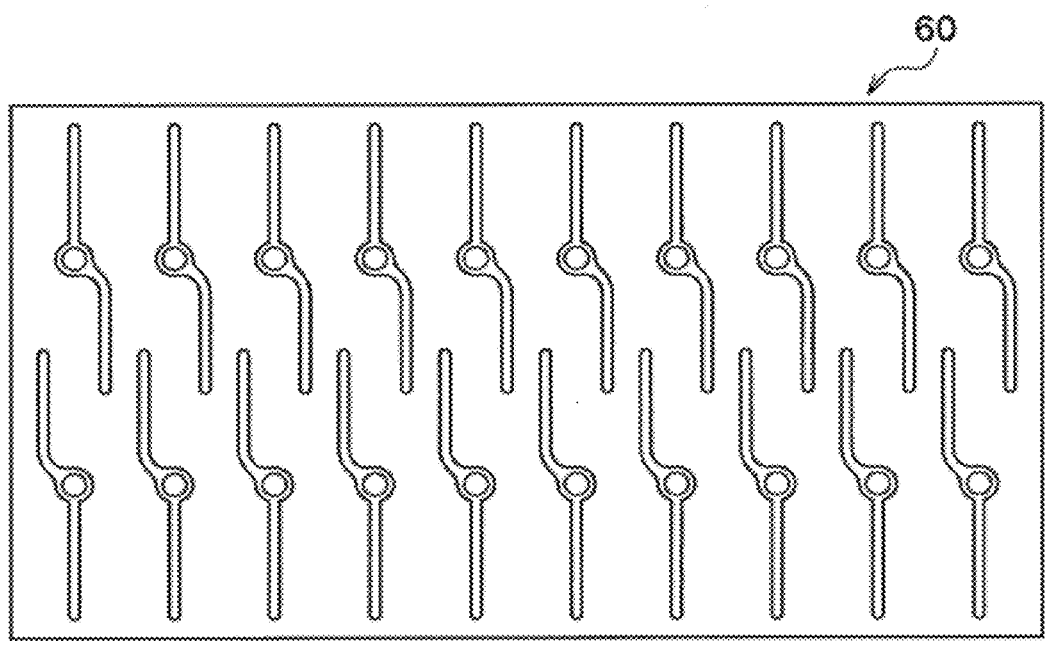
FIG. 21A is a plan view of a semiconductor light emitting element as a concrete example 4 of the present invention.

FIG. 21A is a plan view illustrating the arrangement of the first electrodes in the semiconductor light emitting element 60 as a concrete example 4 of the present invention. The semiconductor light emitting element 60 of the concrete example 4 corresponds to the semiconductor light emitting element 60 according to the sixth embodiment explained before. As illustrated in FIG. 21A, the semiconductor light emitting element 60 of the concrete example 4 has a structure similar to the semiconductor light emitting element 30 of the concrete example 2. However, in the semiconductor light emitting element 60, the first elongated portion and the second elongated portion of each first electrode have an identical dimension in the direction in which the two side faces of the semiconductor layer are opposed (i.e., the vertical direction in FIG. 21A).

Figure 21B:
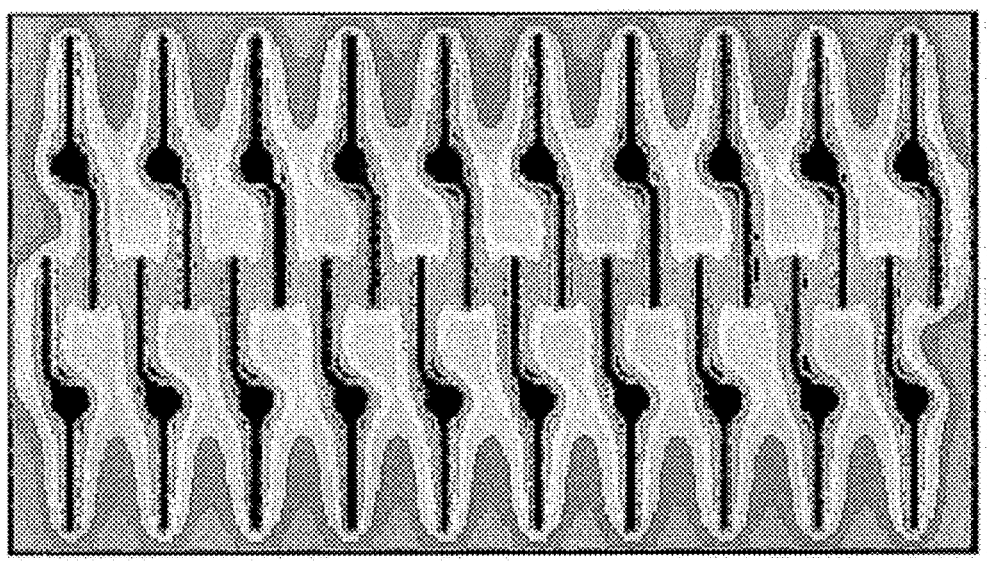
FIG. 21B is a diagram indicating the distribution of the current density in the semiconductor light emitting element of the concrete example 4.

Therefore, the positions of the external connections in the semiconductor light emitting element 60 of the concrete example 4 are brought nearer to the central region than the positions of the external connections in the concrete example 3. Thus, the current density in the central region of the semiconductor layer can be further increased, although insufficiency of current is likely to occur in the central region of the semiconductor layer. Thus, FIG. 21B shows that the variations in the current density between the central region and the regions near the side faces of the semiconductor layer can be reduced in the semiconductor light emitting element 60 having the shapes and arrangement of electrodes as illustrated in FIG. 21A, so that more uniform distribution of light emission is enabled.

13.8 Concrete Example 5

Figure 22A:
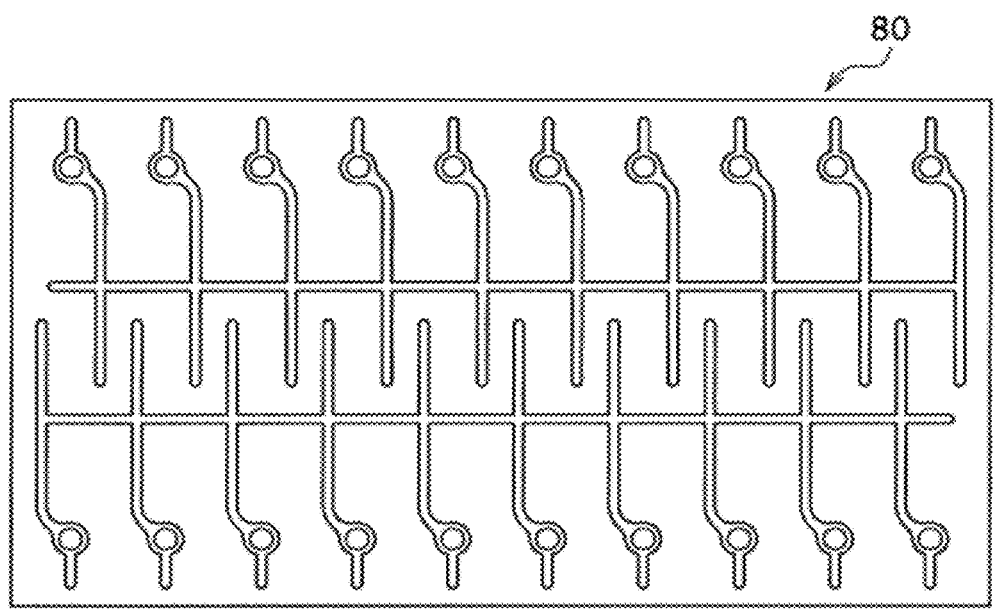
FIG. 22A is a plan view of a semiconductor light emitting element as a concrete example 5 of the present invention.

FIG. 22A is a plan view illustrating the arrangement of the first electrodes in the semiconductor light emitting element 80 as a concrete example 5 of the present invention. The semiconductor light emitting element 80 of the concrete example 5 corresponds to the semiconductor light emitting element 80 according to the eighth embodiment explained before. As illustrated in FIG. 22A, the semiconductor light emitting element 80 of the concrete example 5 has a structure similar to the semiconductor light emitting element 30 of the concrete example 2. However, in the semiconductor light emitting element 80, the first elongated portions of the first half of the set of first electrodes (which are in large part in the aforementioned first region of the upper surface of the semiconductor layer 2) are connected through a first traverse electrode, and the first elongated portions of the second half of the set of first electrodes (which are in large part in the aforementioned second region of the upper surface of the semiconductor layer 2) are connected through a second traverse electrode. The first traverse electrode connects the elongated portions of the first half of the set of first electrodes at the positions at which the elongated portions of the first half of the set of first electrodes do not overlap the first elongated portions of the second half of the set of first electrodes in the direction in which the first electrodes are arrayed (in the horizontal direction in FIG. 22A), and the second traverse electrode connects the elongated portions of the second half of the set of first electrodes at the positions at which the elongated portions of the second half of the set of first electrodes do not overlap the first elongated portions of the first half of the set of first electrodes in the direction in which the first electrodes are arrayed (in the horizontal direction in FIG. 22A).

Figure 22B:
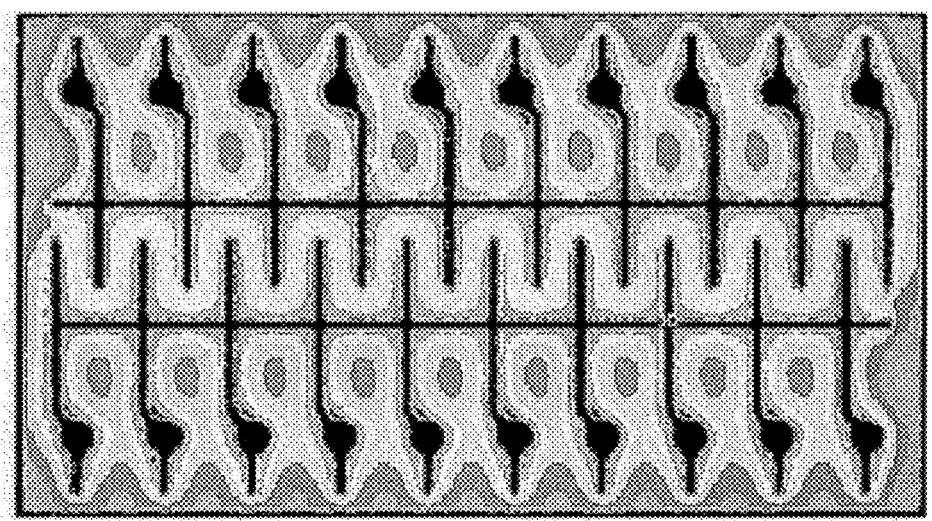
FIG. 22B is a diagram indicating the distribution of the current density in the semiconductor light emitting element of the concrete example 5.

Therefore, the current density in the central region of the semiconductor layer can be increased, although the insufficiency of current is likely to occur in the central region of the semiconductor layer. FIG. 22B shows that the variations in the current density between the central region and the regions near the side faces of the semiconductor layer can be reduced in the semiconductor light emitting element 80 having the shapes and arrangement of electrodes as illustrated in FIG. 22A, so that more uniform distribution of light emission is enabled.

13.9 Concrete Example 6

Figure 23A:
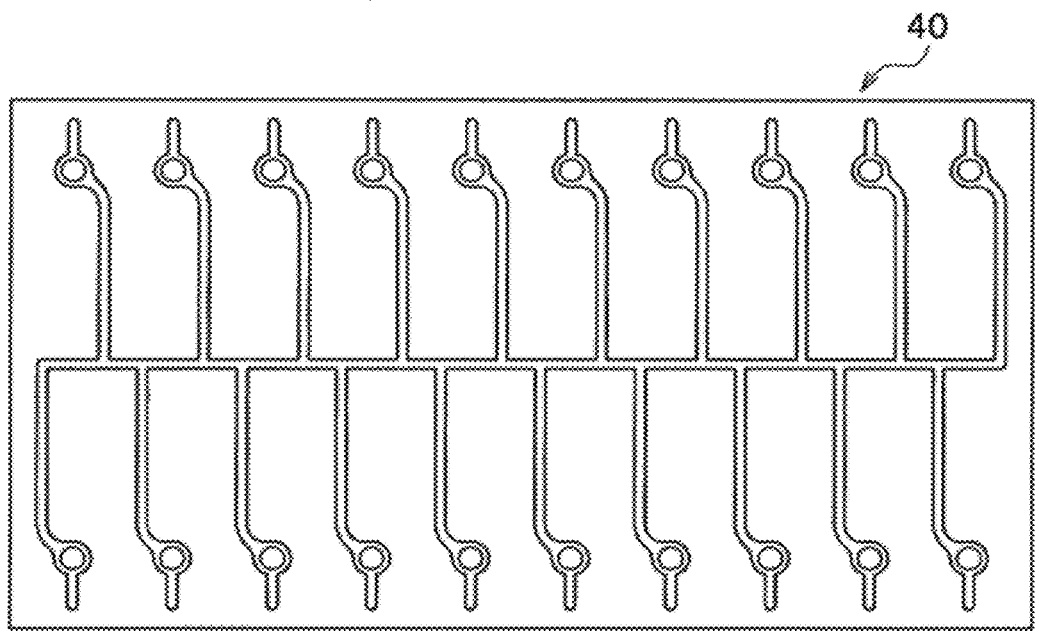
FIG. 23A is a plan view of a semiconductor light emitting element as a concrete example 6 of the present invention.

FIG. 23A is a plan view illustrating the arrangement of the first electrodes in the semiconductor light emitting element 40 as a concrete example 6 of the present invention. The semiconductor light emitting element 40 of the concrete example 6 corresponds to the semiconductor light emitting element 40 according to the fourth embodiment explained before. As illustrated in FIG. 23A, the semiconductor light emitting element 40 of the concrete example 6 has a structure similar to the semiconductor light emitting element 30 of the concrete example 2. However, in the semiconductor light emitting element 40, the ends of the first elongated portions of the first electrodes (including both of the first electrodes which are formed in large part on the aforementioned first region of the upper surface of the semiconductor layer 2 and the first electrodes which are formed in large part on the aforementioned second region of the upper surface of the semiconductor layer 2) are connected on the central region of the upper surface of the semiconductor layer 2 through a traverse electrode.

Figure 23B:
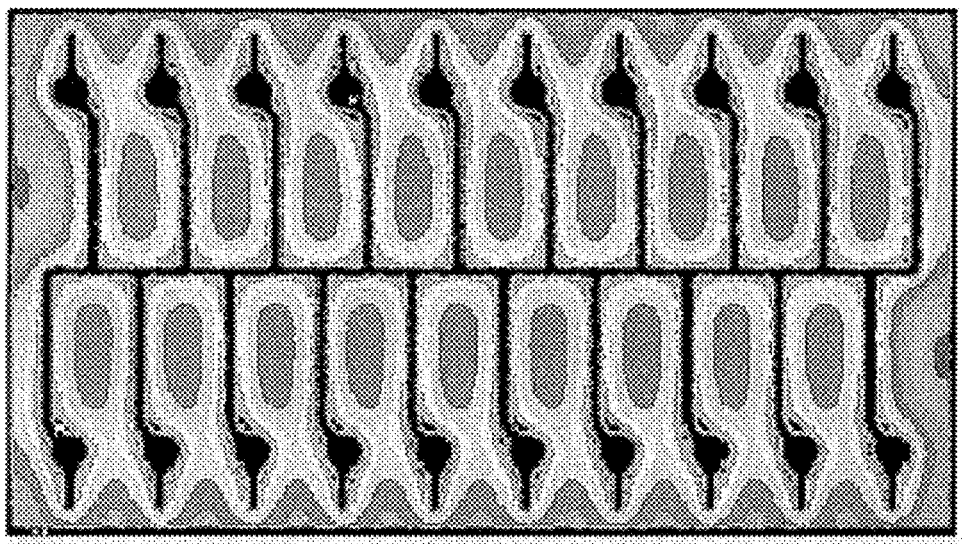
FIG. 23B is a diagram indicating the distribution of the current density in the semiconductor light emitting element of the concrete example 6.

Therefore, as shown in FIG. 23B, the area of electrodes can be increased, and the current can be spread to the central region and the regions near the side faces of the semiconductor layer. In addition, the current density in the semiconductor layer including the central region and the regions near the side faces can be more uniformly increased. That is, FIG. 23B shows that the variations in the current density between the central region and the regions near the side faces of the semiconductor layer can be reduced in the semiconductor light emitting element 40 having the shapes and arrangement of electrodes as illustrated in FIG. 23A, so that more uniform distribution of light emission is enabled.

13.10 Comparison of Experimental Examples

Figures 24A, 24B:
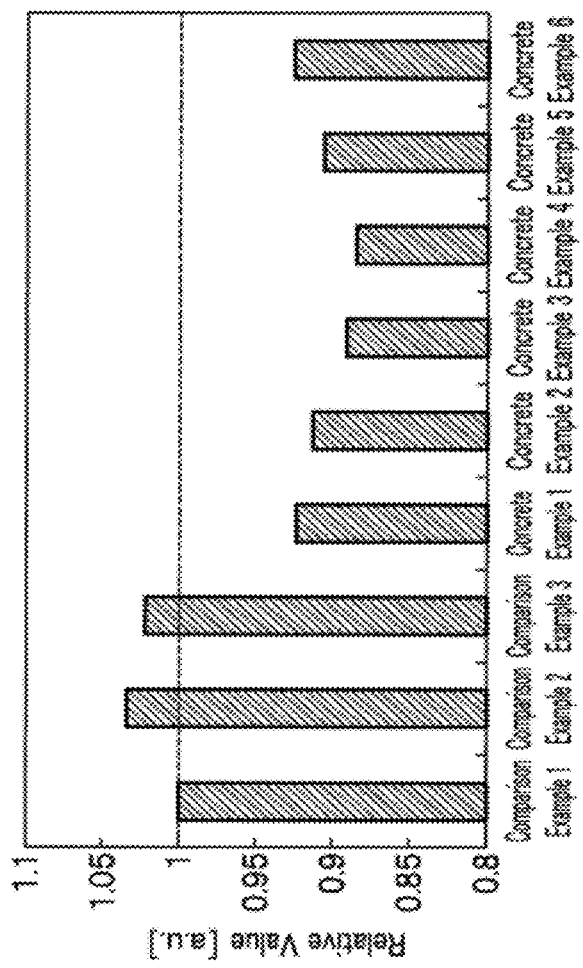
FIG. 24A is a diagram indicating measurement results (including measured values and relative values) of the current density in the semiconductor light emitting elements of the concrete examples of the present invention and the comparison examples.
FIG. 24B is a bar graph indicating the relative values indicating the variations in the current density in the semiconductor light emitting elements of the concrete examples and the comparison examples.

FIG. 24A indicates the maximum values and the minimum values of the current density and the relative values indicating the variations in the current density in the semiconductor light emitting elements of the comparison examples 1 to 3 and the concrete examples 1 to 6. In FIG. 24A, the maximum values of the current density is indicated as "Current MAX", and the minimum values of the current density is indicated as "Current MIN". The relative value indicating the variations in the current density in each semiconductor light emitting element is the value of the difference between the maximum value and the minimum value of the current density relative to the value of the difference in the comparison example 1, i.e., the value obtained by division of the difference between the maximum value and the minimum value of the current density in each semiconductor light emitting element by the difference between the maximum value and the minimum value of the current density in the concrete example 1. The evaluation of the variations in the current density in each semiconductor light emitting element can be easily performed by comparison of the above relative values. The relative values are also indicated in the bar graph of FIG. 24B.

As shown in FIGS. 24A and 24B, the relative values indicating the variations in the current density in the concrete examples 1 to 6 are smaller than the relative value indicating the variations in the current density in the comparison example 1. The semiconductor light emitting element 60 of the concrete example 4 has the smallest relative value. That is, the above experimental results show that the shapes and the arrangement of the electrodes in the semiconductor light emitting element 60 of the concrete example 4 can most reduce the variations in the current density in the semiconductor layer.

On the other hand, the relative values indicating the variations in the current density in the comparison examples 2 and 3 are greater than the relative value indicating the variations in the current density in the comparison example 1. The semiconductor light emitting element 140 as the comparison example 2 has the greatest relative value. That is, the above experimental results show that the shapes and the arrangement of the electrodes in the semiconductor light emitting element 140 of the comparison example 2 can least reduce the variations in the current density in the semiconductor layer.

14. Variations

Figure 25:
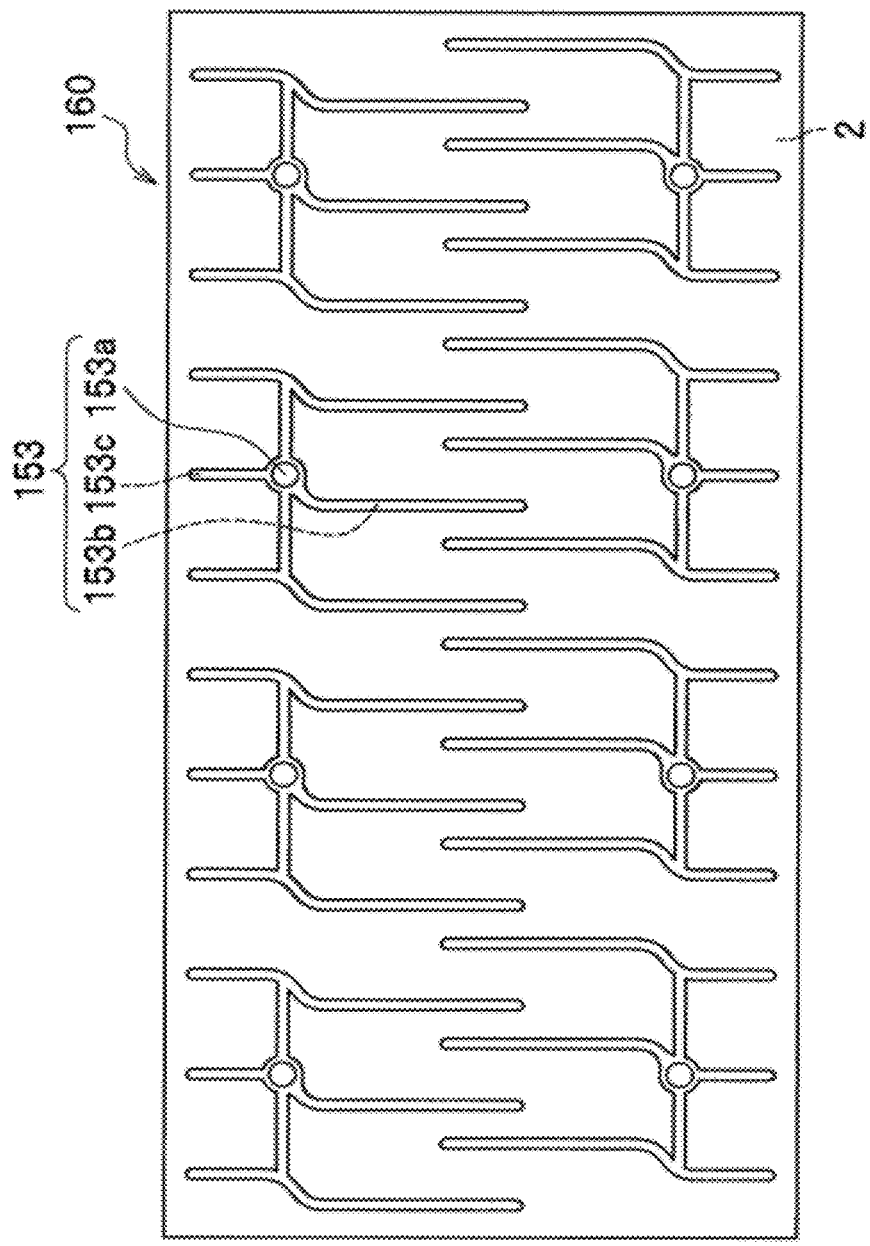
FIG. 25 is a plan view of a semiconductor light emitting element according to a thirteenth embodiment of the present invention.

Although each of the first electrodes 43 or 53 in the semiconductor light emitting element 50 or 60 according to the fifth or sixth embodiment respectively have the external connections 43a or 53a, a predetermined number of the first electrodes 43 or 53 are not necessarily required to have an external connection. FIG. 25 is a plan view of a semiconductor light emitting element 160 according to the thirteenth embodiment of the present invention. In the semiconductor light emitting element 160, the first half of the first electrodes 153 which are in large part formed on the aforementioned first region (the upper half in FIG. 25) of the upper surface of the semiconductor layer 2 include twelve ones of the first electrodes 153, and the second half of the first electrodes 153 which are in large part formed on the aforementioned second region (the lower half in FIG. 25) of the upper surface of the semiconductor layer 2 include an additional twelve of the first electrodes 153. Four of the first electrodes (for example, the second, fifth, eighth, and eleventh ones from the left in FIG. 25) of the twelve first electrodes in the first or second half of the first electrodes 153 have the external connections 153a, and are thus termed "primary first electrodes." The other eight first electrodes do not have external connections, and are thus termed "auxiliary first electrodes." In this case, it is preferable to use the auxiliary first electrodes by connecting the auxiliary first electrodes to a primary first electrode using a traverse electrode. The traverse electrode may extend from the external connection in the primary first electrode. The auxiliary first electrodes may be located on both sides of a primary first electrode. Thus, it is possible to reduce the number of the external connections 153a in the semiconductor light emitting element 160, and therefore reduce the area occupied by the external connections 153a on the semiconductor layer 2. Consequently, light absorption by the external connections 153a can be suppressed, and the light emission area can be increased.

Figure 26:
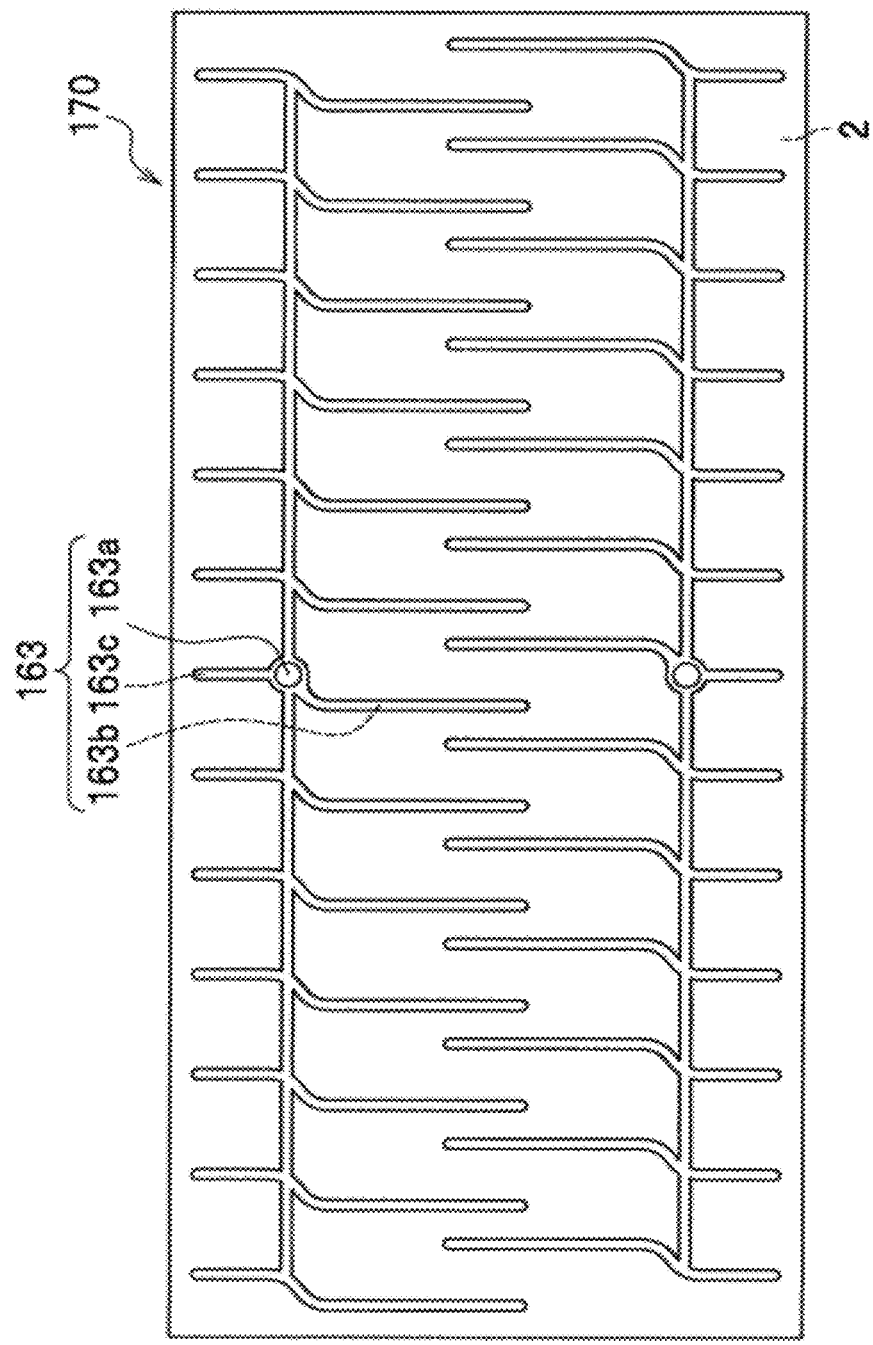
FIG. 26 is a plan view of a semiconductor light emitting element according to a fourteenth embodiment of the present invention.

Alternatively, the semiconductor light emitting element 50 or 60 according to the fifth or sixth embodiment may be modified as illustrated in FIG. 26, which is a plan view of a semiconductor light emitting element 170 according to the fourteenth embodiment of the present invention. That is, it is possible to arrange an external connection 163a in only one of the first electrodes 163 which is located at the center (in the direction of the array of the first electrodes 163) of each of the first and second regions (the upper and lower halves of the semiconductor layer 2 in FIG. 26) of the upper surface of the semiconductor layer 2. This electrode is termed a "primary first electrode." In other words, the external connection is required to be arranged in at least one of the first electrodes 163 in each of the first and second regions of the upper surface of the semiconductor layer 2. The remaining first electrodes do not have external connected, and are thus termed "auxiliary first electrodes." In this case, it is preferable to use the auxiliary first electrodes by connecting the auxiliary first electrodes in each of the first and second regions to the primary first electrode in the same one of the first and second regions via a traverse electrode. The traverse electrode may extend from the external connection of the primary first electrode. Thus, it is possible to reduce the number of the external connections 163a, and therefore reduce the area occupied by the external connections 163a on the semiconductor layer 2. Consequently, light absorption by the external connections 153a can be suppressed, and the light emission area can be increased.

Although the semiconductor light emitting elements according to the present invention have been explained in detail by reference to the embodiments and the concrete examples, the gist of the present invention is not limited to the specifically recited embodiments and examples, and is to be broadly construed on the basis of the appended claims. Further, the scope of the present invention covers any variations and modifications based on the descriptions in the present specification and the appended claims.

What is claimed is:

1. A semiconductor light emitting element comprising:
   a semiconductor layer;
   a plurality of first electrodes arranged in a staggered array on an upper surface of the semiconductor layer; and
   a second electrode on a lower surface of the semiconductor layer;
   wherein each of the first electrodes includes:
      an external connection,
      a first elongated portion which extends from the external connection toward a central region of the upper surface of the semiconductor layer, and
      a second elongated portion which extends from the external connection to a near-edge region of the semiconductor layer; and
   wherein the plurality of first electrodes are arrayed such that a near-tip part of the first elongated portion of each of the first electrodes is opposed to a near-tip part of the first elongated portion of one or more adjacent first electrodes in a direction in which the plurality of first electrodes are arrayed, in the central region of the semiconductor layer.

2. A semiconductor light emitting element comprising:
   a semiconductor layer;
   a plurality of first electrodes arranged in a staggered array on an upper surface of the semiconductor layer;
   a second electrode on a lower surface of the semiconductor layer; and
   a traverse electrode being arranged in a central region of the upper surface of the semiconductor layer and connecting the plurality of first electrodes in the central region;
   wherein each of the first electrodes includes:
      an external connection,
      a first elongated portion which extends from the external connection toward the central region of the upper surface of the semiconductor layer and has an end located in the central region, and
      a second elongated portion which extends from the external connection to a near-edge region of the semiconductor layer in a direction opposite to extension of the first elongated portion;
   wherein the traverse electrode connects the plurality of first electrodes at the end of the first elongated portion; and
   wherein the transverse electrode extends in a direction in which the plurality of first electrodes are arrayed.

3. The semiconductor light emitting element according to claim 1, wherein:
   an external connection of a first one of the first electrodes and an external connection of a second one of the first electrodes are arranged on a straight line in a first direction in which two side faces of the semiconductor layer are opposed to each other,
   a first part of the first elongated portion of the first and second ones of the first electrodes extends in a second direction which is oblique to the first direction, and
   a second part of the first elongated portion of the first and second ones of the first electrodes extends in the first direction.

4. The semiconductor light emitting element according to claim 2, wherein:
   an external connection of a first one of the first electrodes and an external connection of a second one of the first electrodes are arranged on a straight line in a first direction in which two side faces of the semiconductor layer are opposed to each other,
   a first part of the first elongated portion of the first and second ones of the first electrodes extends in a second direction which is oblique to the first direction, and
   a second part of the first elongated portion of the first and second ones of the first electrodes extends in the first direction.

5. The semiconductor light emitting element according to claim 1, wherein:
- the near-tip part of the first elongated portion of each of the first electrodes, which is opposed to the near-tip part of the first elongated portion of the one or more adjacent first electrodes in the direction in which the first electrodes are arrayed, has a first length,
- another part of the first elongated portion of each of the first electrodes, which is not opposed to the first elongated portion of the one or more adjacent first electrodes in the direction in which the first electrodes are arrayed, has a second length, and
- the first length is smaller than the second length.

6. The semiconductor light emitting element according to claim 1, wherein the first elongated portion and the second elongated portion have an identical length in a direction in which two side faces of the semiconductor layer are opposed.

7. The semiconductor light emitting element according to claim 1, wherein:
- electrodes of a subset of the plurality of first electrodes are connected to each other at predetermined positions, and
- the electrodes of the subset are not the electrodes that have opposing near-tip parts.

8. The semiconductor light emitting element according to claim 3, wherein:
- electrodes of a subset of the plurality of first electrodes are connected to each other at predetermined positions, and
- the electrodes of the subset are not the electrodes that have opposing near-tip parts.

9. The semiconductor light emitting element according to claim 1, wherein the first elongated portion branches at the external connection into two subportions, each of which extends toward the central region.

10. The semiconductor light emitting element according to claim 3, wherein the first elongated portion branches at the external connection into two subportions, each of which extends toward the near-edge region.

11. The semiconductor light emitting element according to claim 1, wherein the second elongated portion branches at the external connection into two subportions, each of which extends toward the near-edge region.

12. The semiconductor light emitting element according to claim 9, wherein the second elongated portion branches at the external connection into two subportions, each of which extends toward the near-edge region.

13. The semiconductor light emitting element according to claim 10, wherein the second elongated portion branches at the external connection into two subportions, each of which extends toward the central region.

14. A semiconductor light emitting element comprising:
- a semiconductor layer;
- a plurality of first electrodes arranged in a staggered array on an upper surface of the semiconductor layer; and
- a second electrode on a lower surface of the semiconductor layer;
- wherein each of the first electrodes includes:
    - an external connection,
    - a first elongated portion which extends from the external connection toward a central region of the upper surface of the semiconductor layer, and
    - a second elongated portion which extends from the external connection to a near-edge region of the semiconductor layer; and
- wherein the plurality of first electrodes are arrayed such that a near-tip part of the first elongated portion of each of the first electrodes is opposed to a near-tip part of the first elongated portion of one or more adjacent first electrodes in a direction in which the plurality of first electrodes are arrayed, in the central region of the semiconductor layer,
- wherein the near-tip part of the first elongated portion of each of the first electrodes, which is opposed to the near-tip part of the first elongated portion of the one or more adjacent first electrodes in the direction in which the first electrodes are arrayed, has a first length,
- another part of the first elongated portion of each of the first electrodes, which is not opposed to the first elongated portion of the one or more adjacent first electrodes in the direction in which the first electrodes are arrayed, has a second length,
- the second elongated portion of each of the first electrodes has a third length, and
- the first length is larger than the second length and the third length.

15. The semiconductor light emitting element according to claim 14, wherein the third length is larger than the second length.

16. The semiconductor light emitting element according to claim 14, wherein a ratio of the first length to the second length to the third length is 2:1:1.

17. The semiconductor light emitting element according to claim 15, wherein a ratio of the first length to the second length to the third length is 5:2:3.

18. A semiconductor light emitting element comprising:
- a semiconductor layer;
- a plurality of first electrodes arranged in a staggered array on an upper surface of the semiconductor layer; and
- a second electrode on a lower surface of the semiconductor layer;
- wherein the plurality of first electrodes includes at least one primary first electrode, at least one auxiliary first electrode, and at least one traverse electrode,
- wherein the at least one primary first electrode includes an external connection,
- wherein the at least one auxiliary first electrode is connected to the at least one primary first electrode via the traverse electrode,
- wherein each of the primary first electrodes and each of the auxiliary first electrodes includes:
    - a first elongated portion which extends from the traverse electrode toward a central region of the upper surface of the semiconductor layer, and
    - a second elongated portion which extends from the traverse electrode to a near-edge region of the semiconductor layer; and
- wherein the plurality of first electrodes are arrayed such that a near-tip part of the first elongated portion of each of the first electrodes is opposed to a near-tip part of the first elongated portion of one or more adjacent first electrodes in a direction in which the plurality of first electrodes are arrayed, in the central region of the semiconductor layer.

19. The semiconductor light emitting element according to claim 18, wherein:
- opposing regions of the upper surface of the semiconductor layer each comprise at least one of the primary first electrodes and a plurality of the auxiliary first electrodes, and
- each of the primary first electrodes is connected to exactly two of the auxiliary first electrodes.

20. The semiconductor light emitting element according to claim 18, wherein:
  opposing regions of the upper surface of the semiconductor layer each comprise exactly one of the primary first electrodes and a plurality of the auxiliary first electrodes, and
  the primary first electrode in each section is connected to all the plurality of auxiliary first electrodes in that same section.

\* \* \* \* \*